(12) United States Patent
Hush

(10) Patent No.: US 10,522,212 B2
(45) Date of Patent: Dec. 31, 2019

(54) APPARATUSES AND METHODS FOR SHIFT DECISIONS

(71) Applicant: Micron Technology, Inc., Boise, ID (US)

(72) Inventor: Glen E. Hush, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 27 days.

(21) Appl. No.: 15/552,748

(22) PCT Filed: Mar. 4, 2016

(86) PCT No.: PCT/US2016/020828
§ 371 (c)(1),
(2) Date: Aug. 22, 2017

(87) PCT Pub. No.: WO2016/144724
PCT Pub. Date: Sep. 15, 2016

(65) Prior Publication Data
US 2018/0075899 A1 Mar. 15, 2018

Related U.S. Application Data

(60) Provisional application No. 62/130,713, filed on Mar. 10, 2015.

(51) Int. Cl.
*G06F 12/02* (2006.01)
*G11C 11/4093* (2006.01)
(Continued)

(52) U.S. Cl.
CPC ........ *G11C 11/4093* (2013.01); *G11C 7/1006* (2013.01); *G11C 11/4076* (2013.01); *G11C 11/4091* (2013.01); *G11C 11/4087* (2013.01)

(58) Field of Classification Search
None
See application file for complete search history.

(56) References Cited

U.S. PATENT DOCUMENTS

| 4,380,046 A | 4/1983 | Fung |
| 4,435,792 A | 3/1984 | Bechtolsheim |

(Continued)

FOREIGN PATENT DOCUMENTS

| CN | 102141905 | 8/2011 |
| EP | 0214718 | 3/1987 |

(Continued)

OTHER PUBLICATIONS

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

(Continued)

*Primary Examiner* — Charles Rones
*Assistant Examiner* — Ryan Dare
(74) *Attorney, Agent, or Firm* — Brooks, Cameron & Huebsch, PLLC

(57) ABSTRACT

The present disclosure includes apparatuses and methods for shift decisions. An example apparatus includes a memory device. The memory device includes an array of memory cells and sensing circuitry coupled to the array via a plurality of sense lines. The sensing circuitry includes a sense amplifier and a compute component coupled to a sense line and configured to implement logical operations and a decision component configured to implement a shift of data based on a determined functionality of a memory cell in the array.

27 Claims, 7 Drawing Sheets

(51) Int. Cl.
  *G11C 7/10* (2006.01)
  *G11C 11/4076* (2006.01)
  *G11C 11/4091* (2006.01)
  *G11C 11/408* (2006.01)

(56) References Cited

U.S. PATENT DOCUMENTS

| | | |
|---|---|---|
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffman et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,104,648 A * | 8/2000 | Ooishi ............... G11C 7/1006 365/200 |
| 6,122,211 A | 9/2000 | Morgan et al. |
| 6,125,071 A | 9/2000 | Kohno et al. |
| 6,125,078 A * | 9/2000 | Ooishi ............... G11C 7/1045 365/230.03 |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |

(56) References Cited

U.S. PATENT DOCUMENTS

| | | |
|---|---|---|
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0196030 A1 | 10/2003 | Elliott et al. |
| 2003/0222879 A1 | 12/2003 | Lin et al. |
| 2004/0004866 A1* | 1/2004 | Hidaka ............ G11C 29/808 365/200 |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2008/0291756 A1* | 11/2008 | Joo ............ G11C 7/1006 365/191 |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0134713 A1 | 5/2015 | Wheeler |
| 2015/0324290 A1 | 11/2015 | Leidel |
| 2015/0325272 A1 | 11/2015 | Murphy |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs).

(56) References Cited

OTHER PUBLICATIONS

U.S. Appl. No. 13/743,686, entitled, "Weighted Search and Compare in a Memory Device," filed Jan. 17, 2013, (25 pgs).
U.S. Appl. No. 13/774,636, entitled, "Memory as a Programmable Logic Device," filed Feb. 22, 2013, (30 pgs).
U.S. Appl. No. 13/774,553, entitled, "Neural Network in a Memory Device," filed Feb. 22, 2013, (63 pgs.).
U.S. Appl. No. 13/796,189, entitled, "Performing Complex Arithmetic Functions in a Memory Device," filed Mar. 12, 2013, (23 pgs.).
International Search Report and Written Opinion for PCT Application No. PCT/US2013/043702, dated Sep. 26, 2013, (11 pgs.).
Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.
Pagiamtzis, Kostas, "Content-Addressable Memory Introduction", Jun. 25, 2007, (6 pgs.), retrieved from: http://www.pagiamtzis.com/cam/camintro.
Debnath, Biplob, Bloomflash: Bloom Filter on Flash-Based Storage, 2011 31st Annual Conference on Distributed Computing Systems, Jun. 20-24, 2011, 10 pgs.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.
"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.
Stojmenovic, "Multiplicative Circulant Networks Topological Properties and Communication Algorithms", (25 pgs.), Discrete Applied Mathematics 77 (1997) 281-305.
Boyd et al., "On the General Applicability of Instruction-Set Randomization", Jul.-Sep. 2010, (14 pgs.), vol. 7, Issue 3, IEEE Transactions on Dependable and Secure Computing.
Elliot, et al., "Computational RAM: Implementing Processors in Memory", Jan.-Mar. 1999, (10 pgs.), vol. 16, Issue 1, IEEE Design and Test of Computers Magazine.
International Search Report and Written Opinion for related PCT Application No. PCT/US2016/020828, dated Jun. 24, 2016, 13 pages.
Office Action for related Taiwan Patent Application No. 105107405, dated Apr. 20, 2017, 9 pages.

* cited by examiner

APPARATUSES AND METHODS FOR SHIFT DECISIONS

This application is a National Stage Application under 35 U.S.C. § 371 of PCT Application No. PCT/US2016/020828, having an international filing date of Mar. 4, 2016, which claims priority to U.S. Provisional Application No. 62/130,713, filed Mar. 10, 2015, the contents of which are hereby incorporated by reference in their entireties.

TECHNICAL FIELD

The present disclosure relates generally to semiconductor memory and methods, and more particularly, to apparatuses and methods for shift decisions.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and division on operands via a number of logical operations.

A number of components in an electronic system may be involved in providing instructions to the functional unit circuitry for execution. The instructions may be executed, for instance, by a processing resource such as a controller and host processor. Data (e.g., the operands on which the instructions will be executed) may be stored in a memory array that is accessible by the functional unit circuitry. The instructions and data may be retrieved from the memory array and sequenced and buffered before the functional unit circuitry begins to execute instructions on the data. Furthermore, as different types of operations may be executed in one or multiple clock cycles through the functional unit circuitry, intermediate results of the instructions and data may also be sequenced and buffered.

In many instances, the processing resources (e.g., processor and associated functional unit circuitry) may be external to the memory array, and data is accessed via a bus between the processing resources and the memory array to execute a set of instructions. Processing performance may be improved in a processor-in-memory device, in which a processor may be implemented internal and near to a memory (e.g., directly on a same chip as the memory array). A processing-in-memory device may save time by reducing and eliminating external communications and may also conserve power. However, shifting of data (e.g., right or left) in a memory array of a processing-in-memory device may be influenced by an operative status, e.g., functionality, of one or more memory cells in a neighboring column of memory cells in the memory array.

DETAILED DESCRIPTION

Figure 1A:
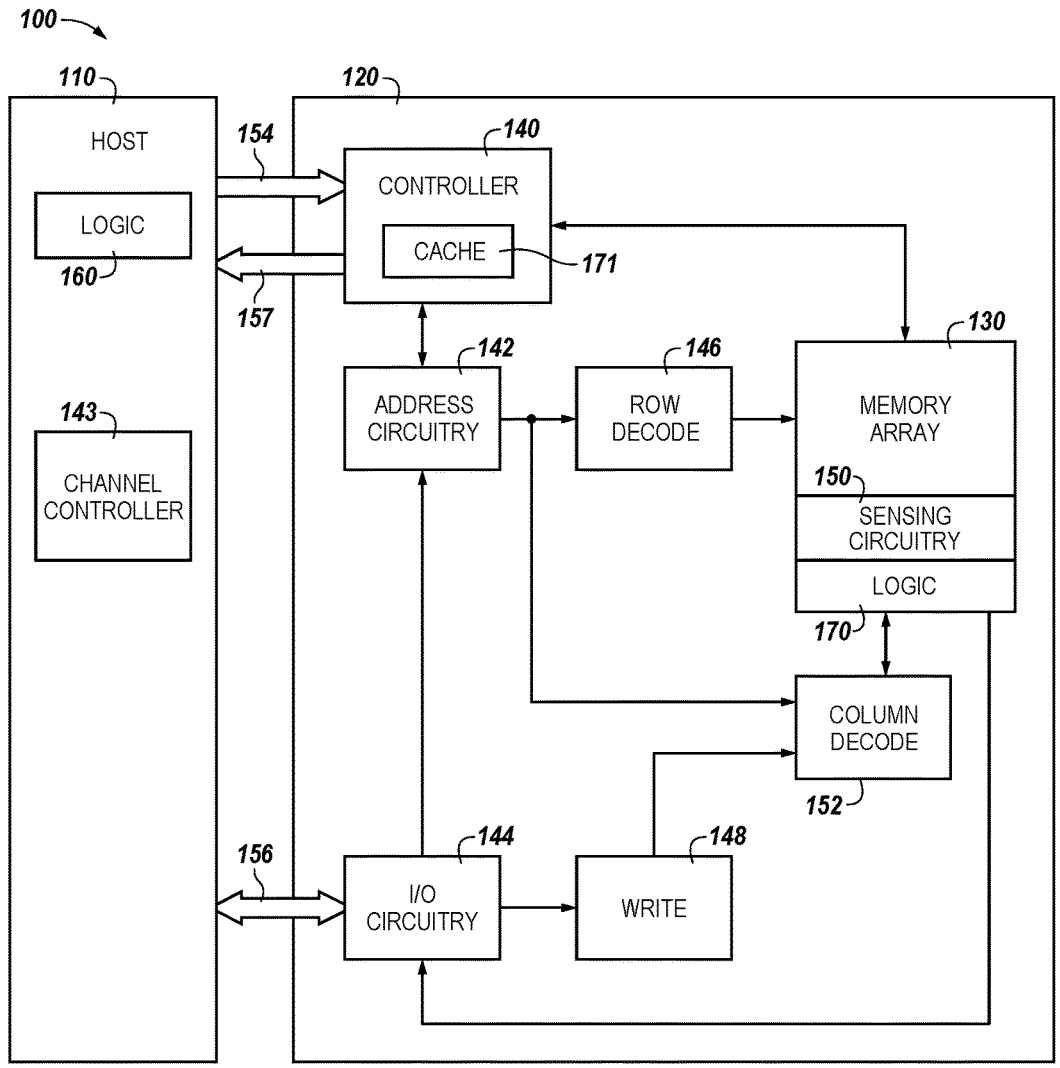
FIG. 1A is a block diagram of an apparatus in the form of a computing system including a memory device in accordance with a number of embodiments of the present disclosure.

The present disclosure includes apparatuses and methods for shift decisions, e.g., for data in processor-in-memory (PIM) structures. In at least one embodiment, the apparatus includes a memory device. The memory device includes an array of memory cells and sensing circuitry coupled to the array via a plurality of sense lines. The sensing circuitry includes a sense amplifier and a compute component coupled to a sense line and configured to implement logical operations and a decision component configured to implement a shift of data based on a determined functionality of a memory cell in the array.

As described in more detail below, the embodiments can allow a host system to allocate a number of locations, e.g., sub-arrays (or "subarrays") and portions of subarrays, in one or more DRAM banks to hold (e.g., store) data. A host system and a controller may perform the address resolution on an entire block of program instructions, e.g., PIM command instructions, and data and direct (e.g., control) allocation and storage of data and commands into allocated locations, e.g., subarrays and portions of subarrays within a destination (e.g., target) bank. Writing data and commands may utilize a normal DRAM write path to the DRAM device. As the reader will appreciate, while a DRAM-style PIM device is discussed with regard to examples presented herein, embodiments are not limited to a PIM DRAM implementation.

Previous approaches to DRAM column repair, e.g., when at least one memory cell in the column does not function to an expected level and can therefore be termed "defective", have included substituting a column with all memory cells in the column functioning at the expected level, e.g., normal, for the column in which at least one memory cell has a defective function. Whereas the column having at least one memory cell with a defective function can be anywhere in the array of memory cells, the column with all memory cells functioning at the normal level to which data from the column having a defective functionality is instead transferred, e.g., written or shifted, is at a physical position at an end of the array, e.g., a left and/or a right end relative to the column with the defective functionality.

For PIM DRAM implementations, the previous approach may interfere with functional operations. For instance, in PIM DRAM memory, data (e.g., one or more of data values, data states, logic states, operands, etc.) can be shifted (e.g., left or right) from one column to another column (e.g., to an adjacent or nearby column). As such, all columns to which data can be shifted during a shift operation should be physically positioned relatively close to each other to facilitate the shift operation.

Accordingly, the present disclosure presents structures and processes that can improve on the previous approach in PIM DRAM implementations by, for example, skipping (e.g., hopping over) during a shift operation a block of columns having at least one memory cell with a defective functionality to, for example, a next block where all memory cells have a normal functionality, as described herein. The present disclosure also presents structures and processes involved in making a decision as to which block of columns is skipped and to which column the data is shifted.

In addition, in previous approaches, data may be transferred from the array and sensing circuitry (e.g., via a bus comprising input/output (I/O) lines) to a processing resource such as a processor, microprocessor, and compute engine, which may comprise ALU circuitry and other functional unit circuitry configured to perform the appropriate logical operations. However, transferring data from a memory array and sensing circuitry to such processing resource(s) can involve significant power consumption. Even if the processing resource is located on a same chip as the memory array, significant power can be consumed in moving data out of the array to the compute circuitry, which can involve performing a sense line (which may be referred to herein as a data line or digit line) address access (e.g., firing of a column decode signal) in order to transfer data from sense lines onto I/O lines (e.g., local and global I/O lines), moving the data to the array periphery, and providing the data to the compute function.

Furthermore, the circuitry of the processing resource(s) (e.g., a compute engine) may not conform to pitch rules associated with a memory array. For example, the cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on pitch with the memory cells, which can affect chip size and memory density, for example.

A number of embodiments of the present disclosure include sensing circuitry and logic circuitry formed on pitch with an array of memory cells. The sensing circuitry and logic circuitry are capable of performing sensing, compute, decision, and storage, e.g., caching, functions on data local to the array of memory cells.

In order to appreciate the improved data shift decision techniques described herein, a discussion of an apparatus for implementing such techniques, e.g., a memory device having PIM capabilities and associated host, follows. According to various embodiments, program instructions, e.g., PIM commands, involving a memory device having PIM capabilities can distribute implementation of the PIM commands and data over multiple sensing circuitries that can implement logical operations and can move and store the PIM commands and data within the memory array, e.g., without having to transfer such back and forth over an A/C and data bus between a host and the memory device. Thus, data for a memory device having PIM capabilities can be accessed and used in less time and using less power. For example, a time and power advantage can be realized by increasing the speed, rate, and efficiency of data being moved around and stored in a computing system in order to process requested memory array operations (e.g., reads, writes, shifts, etc.).

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "X", "Y", "N", "M", etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a", "an", and "the" include singular and plural referents, unless the context clearly dictates otherwise, as do "a number of", "at least one", and "one or more" (e.g., a number of memory arrays can refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically or for access to and movement (transmission) of instructions (e.g., control signals) and data, as appropriate to the context.

The figures herein follow a numbering convention in which the first digit or digits correspond to the figure number and the remaining digits identify an element or component in the figure. Similar elements or components between different figures may be identified by the use of similar digits. For example, 108 may reference element "08" in FIG. 1, and a similar element may be referenced as 208 in FIG. 2. As will be appreciated, elements shown in the various embodiments herein can be added, exchanged, and eliminated so as to provide a number of additional embodiments of the present disclosure. In addition, the proportion and the relative scale of the elements provided in the figures are intended to illustrate certain embodiments of the present disclosure and should not be taken in a limiting sense.

FIG. 1A is a block diagram of an apparatus in the form of a computing system 100 including a memory device 120 in accordance with a number of embodiments of the present disclosure. As used herein, a memory device 120, controller 140, channel controller 143, memory array 130, sensing circuitry 150, including sensing amplifiers, compute circuitry, shift circuitry, indicator component circuitry, and decision component circuitry, and peripheral sense amplifier and logic 170 might each also be separately considered an "apparatus."

The system 100 can include a host 110 coupled (e.g., connected) to memory device 120, which includes the memory array 130. Host 110 can be a host system such as a personal laptop computer, a desktop computer, a tablet computer, a digital camera, a smart phone, or a memory card reader, among various other types of hosts. Host 110 can include a system motherboard and backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and a high performance computing (HPC) system and a portion thereof. Although the example shown in FIG. 1A illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, description of the system 100 has been simplified to focus on features with particular relevance to the present disclosure. For example, in various embodiments, the memory array 130 can be a DRAM array, SRAM array, STT RAM array, PCRAM array, TRAM array, RRAM array, NAND flash array, and NOR flash array, for instance. The memory array 130 can include memory cells arranged in rows coupled by access lines (which may be referred to herein as word lines or select lines) and columns coupled by sense lines (which may be referred to herein as data lines or digit lines). Although a single memory array 130 is shown in FIG. 1A, embodiments are not so limited. For instance, memory device 120 may include a number of memory arrays 130 (e.g., a number of banks of DRAM cells, NAND flash cells, etc.) in addition to a number subarrays, as described herein.

The memory device 120 can include address circuitry 142 to latch address signals provided over a data bus 156 (e.g., an I/O bus from the host 110) by I/O circuitry 144 (e.g., provided to external ALU circuitry and to DRAM DQs via local I/O lines and global I/O lines). Status and exception information can be provided from the controller 140 on the memory device 120 to a channel controller 143, for example, through a high speed interface (HSI) out-of-band bus 157, which in turn can be provided from the channel controller 143 to the host 110. Address signals are received through address circuitry 142 and decoded by a row decoder 146 and a column decoder 152 to access the memory array 130. Data can be sensed (read) from memory array 130 by sensing voltage and current changes on sense lines (digit lines) using a number of sense amplifiers, as described herein, of the sensing circuitry 150. A sense amplifier can read and latch a page (e.g., a row) of data from the memory array 130. Additional compute circuitry, as described herein, can be coupled to the sensing circuitry 150 and can be used in combination with the sense amplifiers to sense, store, e.g., cache and buffer, and move data. The I/O circuitry 144 can be used for bi-directional data communication with host 110 over the data bus 156 (e.g., a 64 bit wide data bus). The write circuitry 148 can be used to write data to the memory array 130.

Controller 140, e.g., bank control logic and sequencer, can decode signals (e.g., commands) provided by control bus 154 from the host 110. These signals can include chip enable signals, data shift signals, write enable signals, and address latch signals that can be used to control operations performed on the memory array 130, including data sense, data store, data shift, data write, and data erase operations, among other operations. For example, the controller 140 can control shifting data (e.g., right or left) in a row of an array, e.g., memory array 130, by issuing control signals determined from the decoded commands from the host 110. In various embodiments, the controller 140 can be responsible for executing instructions from the host 110 and accessing the memory array 130 via the control signals. Such control signals may be executed by processing resources external to and/or internal to a memory array 130 (e.g., by compute components 231 in sensing circuitry 150, as described herein). The controller 140 can be a state machine, a sequencer, or some other type of controller.

Examples of the sensing circuitry 150 are described further below, e.g., in connection with FIGS. 2-5. For instance, in a number of embodiments, the sensing circuitry 150 can include a number of sense amplifiers and a number of compute components, which may serve as an accumulator and can be used to perform logical operations (e.g., on data associated with complementary sense lines).

In a number of embodiments, the sensing circuitry 150 can be used to perform logical operations using data stored in memory array 130 as inputs and participate in movement of the data for writing and storage operations back to a different location in the memory array 130 without transferring the data via a sense line address access (e.g., without firing a column decode signal). As such, various compute functions can be performed using, and within, sensing circuitry 150 rather than (or in association with) being performed by processing resources external to the sensing circuitry 150 (e.g., by a processor associated with host 110 and other processing circuitry, such as ALU circuitry, located on device 120, such as on controller 140 or elsewhere).

In various previous approaches, data associated with an operand, for instance, would be read from memory via sensing circuitry and provided to external ALU circuitry via I/O lines (e.g., via local I/O lines and global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform logical operations on data stored in memory array 130 and store the result back to the memory array 130 without enabling a local I/O line and global I/O line coupled to the sensing circuitry 150. The sensing circuitry 150 can be formed on pitch with the memory cells of the array. Additional peripheral sense amplifier and logic 170 can be coupled to the sensing circuitry 150. The sensing circuitry 150 and the peripheral sense amplifier and logic 170 can cooperate in performing logical operations, according to some embodiments described herein.

As such, in a number of embodiments, circuitry external to memory array 130 and sensing circuitry 150 is not needed to perform compute functions because the sensing circuitry 150 can perform the appropriate logical operations in order to perform such compute functions without the use of an external processing resource. Therefore, the sensing circuitry 150 may be used to complement and to replace, at least to some extent, such an external processing resource (or at least the bandwidth consumption of such an external processing resource).

In a number of embodiments, the sensing circuitry 150 may be used to perform logical operations (e.g., to execute instructions) in addition to logical operations performed by an external processing resource (e.g., host 110). For instance, either of the host 110 and the sensing circuitry 150 may be limited to performing only certain logical operations and a certain number of logical operations.

Enabling a local I/O line and global I/O line can include enabling (e.g., turning on) a transistor having a gate coupled to a decode signal (e.g., a column decode signal) and a source/drain coupled to the I/O line. However, embodiments are not limited to not enabling a local I/O line and global I/O line. For instance, in a number of embodiments, the sensing circuitry 150 can be used to perform logical operations without enabling column decode lines of the array. However, the local I/O line(s) and the global I/O line(s) may be enabled in order to transfer a result to a suitable location other than back to the memory array 130 (e.g., to an external register).

Figure 1B:
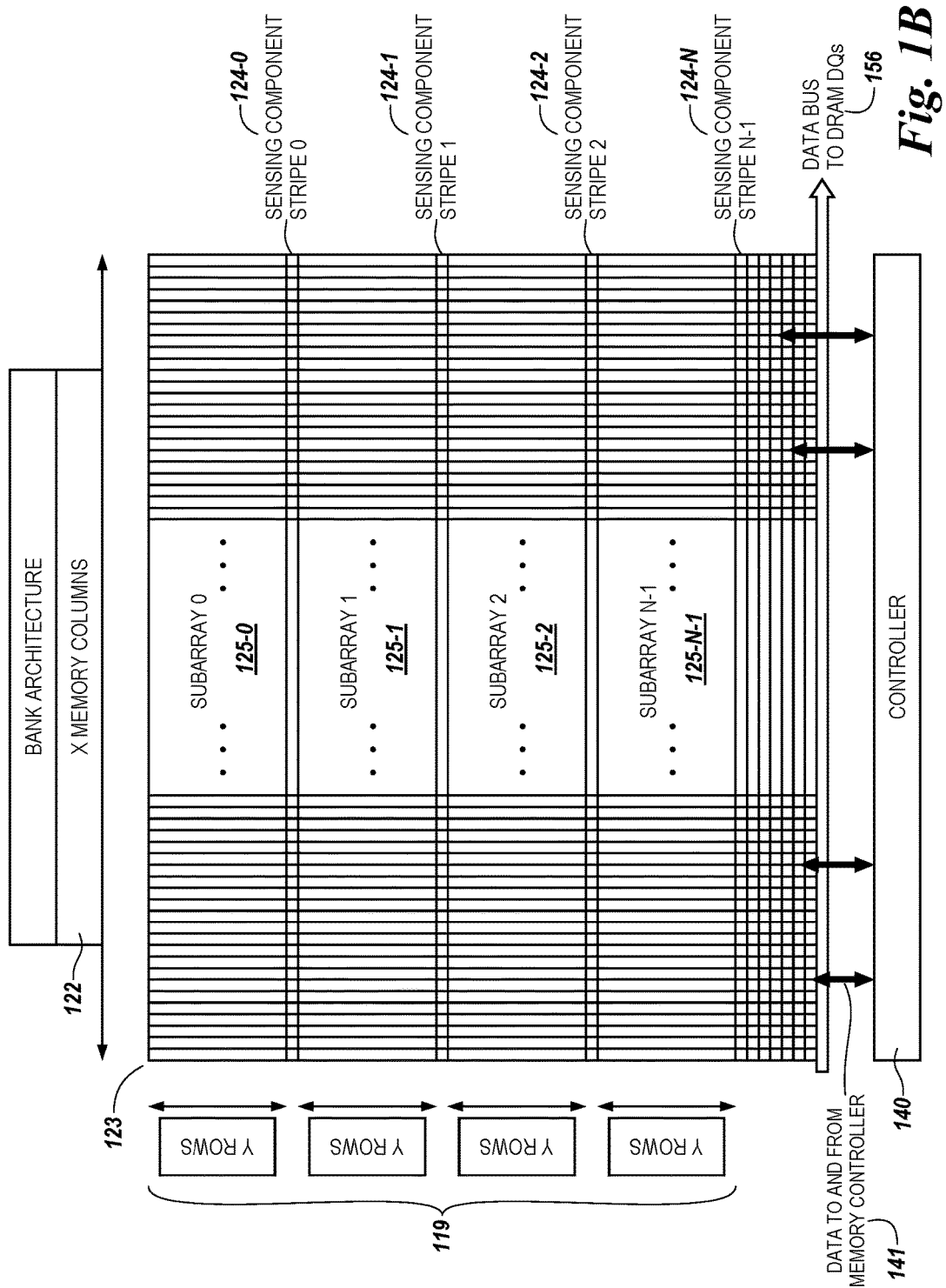
FIG. 1B is a block diagram of a bank section to a memory device in accordance with a number of embodiments of the present disclosure.
Figure 1C:
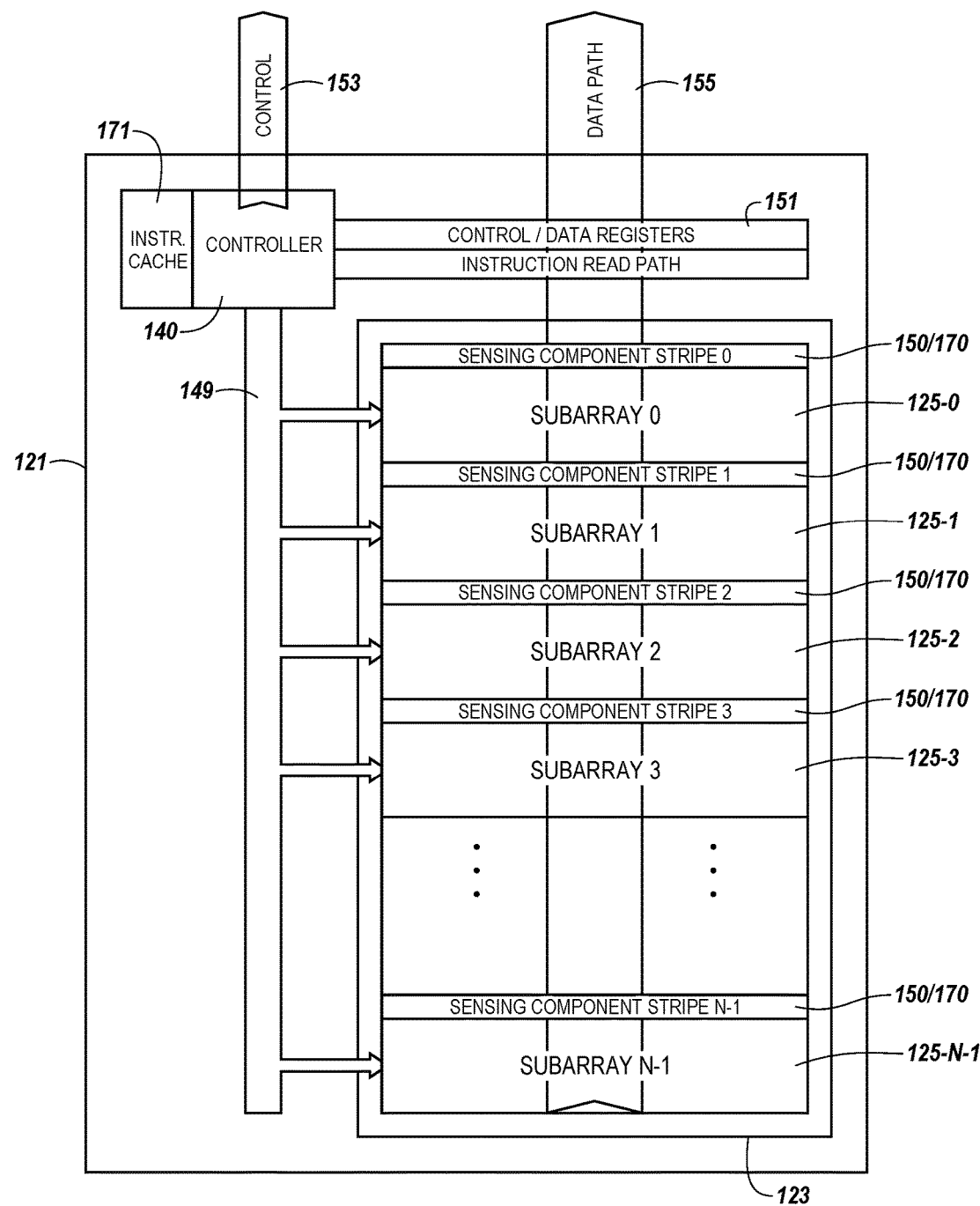
FIG. 1C is a block diagram of a bank to a memory device in accordance with a number of embodiments of the present disclosure.

FIG. 1B is a block diagram of a bank section 123 to a memory device in accordance with a number of embodiments of the present disclosure. For example, bank section 123 can represent an example section of a number of bank sections to a bank of a memory device (e.g., bank section 0, bank section 1, . . . , bank section M). As shown in FIG. 1B, a bank architecture can include a plurality of memory columns 122 shown horizontally as X (e.g., 16,384 columns in an example DRAM bank and bank section). Additionally, the bank section 123 may be divided into subarray 0, subarray 1, . . . , and subarray N−1 (e.g., 128 subarrays) shown at 125-0, 125-1, . . . , 125-N−1, respectively, that are separated by amplification regions configured to be coupled to a data path 155, as shown in FIG. 1C. As such, the subarrays shown at 125-0, 125-1, . . . , 125-N−1 each can have amplification regions shown at 124-0, 124-1, . . . , 124-N−1 that correspond to sensing component stripe 0, sensing component stripe 1, . . . , and sensing component stripe N−1, respectively.

Each column 122 is configured to be coupled to sensing circuitry 150, as described with regard to FIG. 1A and elsewhere herein. As such, each column in a subarray can be coupled individually to a sense amplifier and compute component that contribute to a sensing component stripe for that subarray. For example, as shown in FIG. 1B, the bank architecture can include sensing component stripe 0, sensing component stripe 1, . . . , sensing component stripe N−1 that each have sensing circuitry 150 with sense amplifiers and compute components that can, in various embodiments, be used as registers, cache, and data buffering and that are coupled to each column 122 in the subarrays at 125-0, 125-1, . . . , 125-N−1. The compute component within the sensing circuitry 150 coupled to the memory array 130, as shown in FIG. 1A, can complement the cache 171 associated with the controller 140.

Each of the of the subarrays at 125-0, 125-1, . . . , 125-N−1 can include a plurality of rows 119 shown vertically as Y (e.g., each subarray may include 512 rows in an example DRAM bank). Embodiments are not limited to the example horizontal and vertical orientation of columns and rows described herein or the example numbers thereof.

As shown in FIG. 1B, the bank architecture can be associated with controller 140. The controller 140 shown in FIG. 1B can, in various examples, represent at least a portion of the functionality embodied by and contained in the controller 140 shown in FIG. 1A. The controller 140 can direct (e.g., control) input of commands and data 141 to the bank architecture and output of data from the bank architecture, e.g., to the host 110, along with control of data shifts in the bank architecture, as described herein. The bank architecture can include a data bus 156 (e.g., a 64 bit wide data bus) to DRAM DQs, which can correspond to the data bus 156 described with regard to FIG. 1A.

FIG. 1C is a block diagram of a bank 121 to a memory device in accordance with a number of embodiments of the present disclosure. For example, bank 121 can represent an example bank to a memory device (e.g., bank 0, bank 1, . . . , bank M). As shown in FIG. 1C, a bank architecture can include an address/control (A/C) path 153, e.g., a bus, coupled a controller 140. Again, the controller 140 shown in FIG. 1C can, in various examples, represent at least a portion of the functionality embodied by and contained in the controller 140 shown in FIGS. 1A and 1B.

As shown in FIG. 1C, a bank architecture can include a plurality of bank sections, e.g., bank section 123, in a particular bank 121. As further shown in FIG. 1C, a bank section 123 can be subdivided into a plurality of subarrays (e.g., subarray 0, subarray 1, . . . , subarray N−1 shown at 125-1, 125-2, . . . , 125-N−1) respectively separated by sensing component stripes 124-0, 124-1, . . . , 124-N−1, as shown in FIG. 1B, that include sensing circuitry 150 and logic circuitry 170. As noted, the sensing component stripes 124-0, 124-1, . . . , , 124-N−1 each include sensing circuitry 150, having sense amplifiers, compute components, shift circuitry, indicator component circuitry, decision component circuitry, and logic 170 configured to couple to each column of memory cells in each subarray, as shown in FIG. 1A and described further in connection with FIGS. 2-5.

As shown schematically in FIG. 1C, an architecture of a bank 121 and each section 123 of the bank can include a data path 155, e.g., bus, coupled to a plurality of control/data registers in an instruction and/or data, e.g., program instructions (PIM commands), read path and coupled to a plurality of bank sections, e.g., bank section 123, in a particular bank 121. The controller 140 can be configured to receive a command to start execution of an operation in a given bank, e.g., bank 121-1. The controller 140 may be configured to retrieve instructions and/or constant data, e.g., using data path 155 with control and data registers 151, from the plurality of locations for the particular bank and execute using the compute component of the sensing circuity 150. The controller 140 may cache retrieved instructions and/or constant data local to the particular bank, e.g., in instruction cache 171 and/or logic circuitry 170.

In some embodiments, the controller 140 may be configured to provide instructions (control signals based on commands) and data to a plurality of locations of a particular bank 121 in the memory array 130 and to the sensing component stripes 124-0, 124-1, . . . , 124-N−1 via the data path 155 with control and data registers 151. For example, the control and data registers 151 can provide instructions to be executed by the sense amplifiers and the compute components of the sensing circuity 150 in the sensing component stripes 124-0, 124-1, . . . , 124-N−1. FIG. 1C illustrates the instruction cache 171 associated with the controller 140 and coupled to a write path 149 to each of the subarrays 125-0, . . . , 125-N−1 in the bank 121.

Implementations of PIM DRAM architecture may perform processing at the sense amplifier and compute component level. Implementations of PIM DRAM architecture may allow a finite number of memory cells to be connected to each sense amplifier (e.g., around 512 memory cells). A sensing component stripe 124 may include from around 8,000 to around 16,000 sense amplifiers. For example, a sensing component stripe 124 may be configured to couple to an array of 512 rows and around 16,000 columns. A sensing component stripe can be used as a building block to construct the larger memory. In an array for a memory device, there may be 128 sensing component stripes, which corresponds to 128 subarrays, as described herein. Hence, 512 rows times 128 sensing component stripes would yield around 66,000 rows intersected by around 16,000 columns to form around a 1 gigabit DRAM. As such, compared other PIM DRAM implementations, utilization of the structures and processes described in the present disclosure saves time for data processing (e.g., by reducing external communications by not having to read data out of one bank, bank section, and subarray thereof, storing the data, and then writing the data in another location) and may also conserve power.

Figure 2:
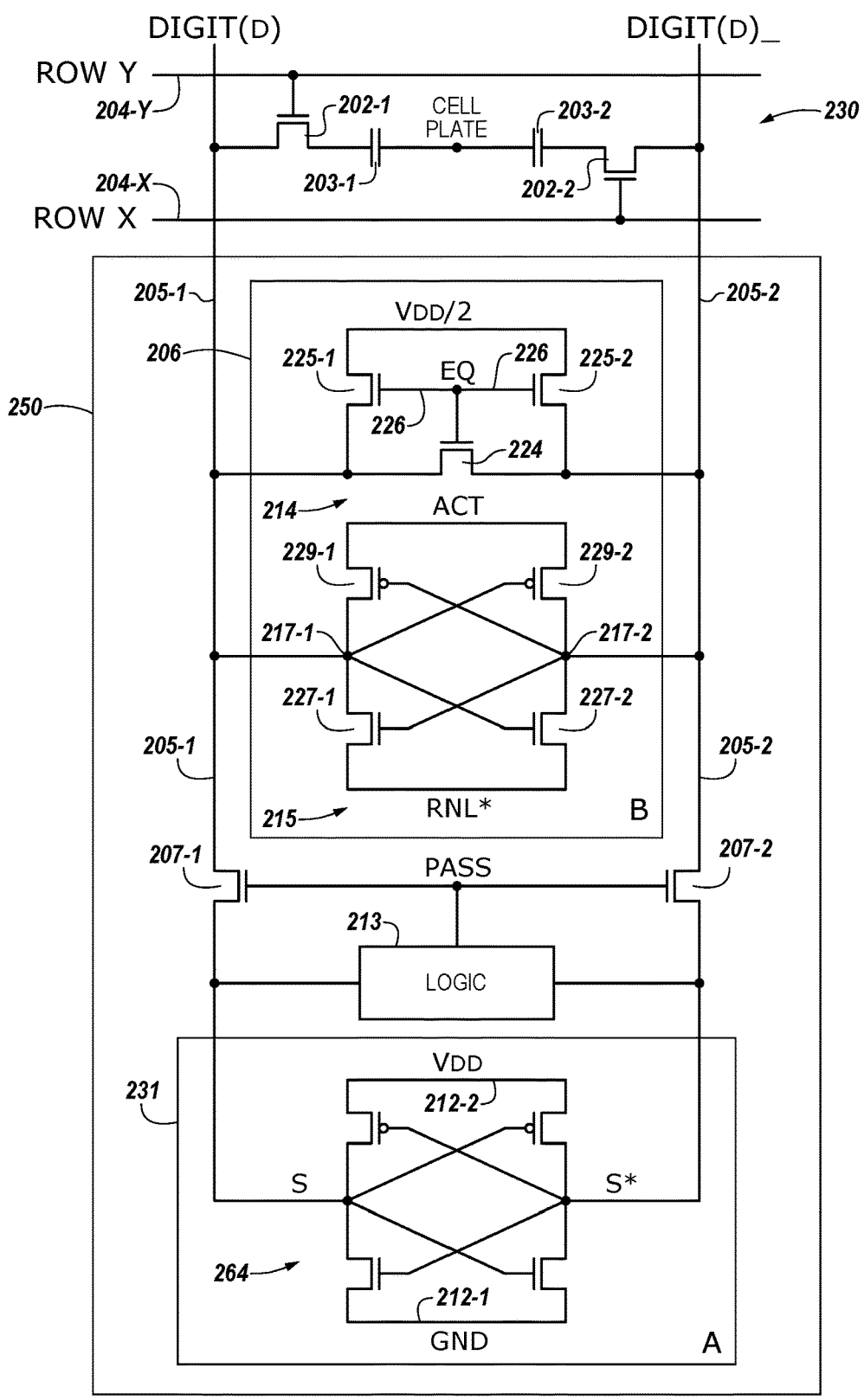
FIG. 2 is a schematic diagram illustrating a portion of a memory array coupled to sensing circuitry in accordance with a number of embodiments of the present disclosure.

FIG. 2 is a schematic diagram illustrating a portion of a memory array 230 coupled to sensing circuitry 250 in accordance with a number of embodiments of the present disclosure. The sensing circuitry 250 illustrated in FIG. 2 can, in various examples, represent at least a portion of the functionality embodied by and contained in the sensing circuitry 150 shown in FIG. 1A and described in connection with FIGS. 1A-1C.

A memory cell can include a storage element (e.g., capacitor) and an access device (e.g., transistor). For instance, a first memory cell can include transistor 202-1 and capacitor 203-1, and a second memory cell can include transistor 202-2 and capacitor 203-2, etc. In this embodiment, the memory array 230 is a DRAM array of 1T1C (one transistor one capacitor) memory cells, although other embodiments of configurations can be used (e.g., 2T2C with two transistors and two capacitors per memory cell). In a number of embodiments, the memory cells may be destructive read memory cells (e.g., reading the data stored in the cell destroys the data such that the data originally stored in the cell is refreshed after being read).

Figure 3:
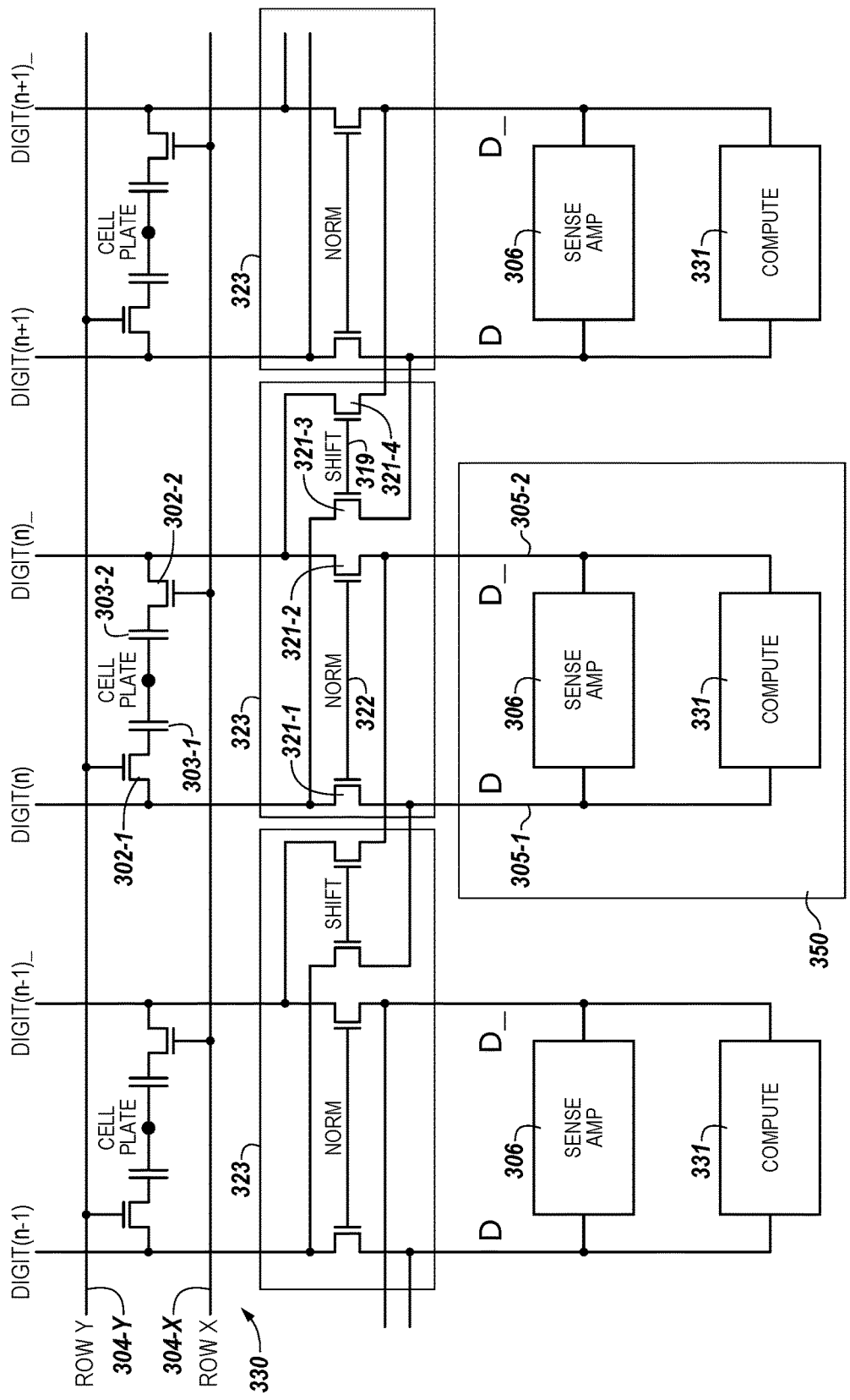
FIG. 3 is another schematic diagram illustrating a portion of a memory array coupled to sensing circuitry in accordance with a number of embodiments of the present disclosure.
Figure 4:
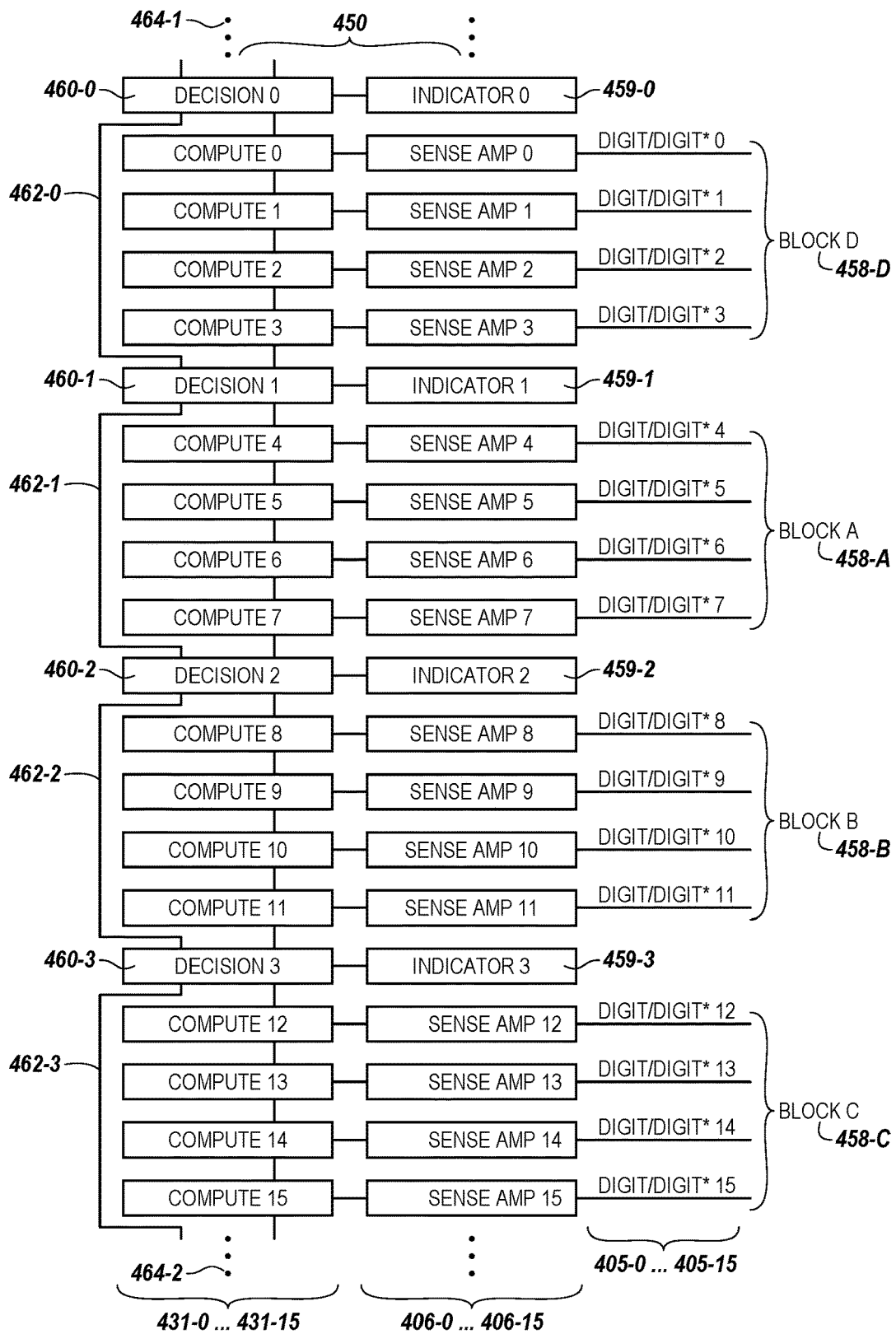
FIG. 4 is a schematic diagram illustrating sensing circuitry coupled to sense lines in accordance with a number of embodiments of the present disclosure.

The cells of the memory array 230 can be arranged in rows coupled by access (word) lines 204-X (Row X), 204-Y (Row Y), etc., and columns coupled by pairs of complementary sense lines (e.g., digit lines DIGIT(D) and DIGIT (D)_ shown in FIG. 2, DIGIT(n−1)/DIGIT(n−1)_, DIGIT (n)/DIGIT(n)_, DIGIT(n+1)/DIGIT(n+1)_ shown in FIG. 3, and DIGIT and DIGIT* shown in FIG. 4. The individual sense lines corresponding to each pair of complementary sense lines can also be referred to as digit lines 205-1 for DIGIT (D) and 205-2 for DIGIT (D)_, respectively, in FIG. 2 or corresponding reference numbers in FIG. 3. Although only one pair of complementary digit lines is shown in FIG. 2, embodiments of the present disclosure are not so limited, and an array of memory cells can include additional columns of memory cells and digit lines (e.g., 4,096, 8,192, 16,384, etc.).

Memory cells can be coupled to different digit lines and word lines. For example, a first source/drain region of a transistor 202-1 can be coupled to digit line 205-1 (D), a second source/drain region of transistor 202-1 can be coupled to capacitor 203-1, and a gate of a transistor 202-1 can be coupled to word line 204-Y. A first source/drain region of a transistor 202-2 can be coupled to digit line 205-2 (D)_, a second source/drain region of transistor 202-2 can be coupled to capacitor 203-2, and a gate of a transistor 202-2 can be coupled to word line 204-X. A cell plate, as shown in FIG. 2, can be coupled to each of capacitors 203-1 and 203-2. The cell plate can be a common node to which a reference voltage (e.g., ground) can be applied in various memory array configurations.

The memory array 230 is configured to couple to sensing circuitry 250 in accordance with a number of embodiments of the present disclosure. In the embodiment illustrated in FIG. 2, the sensing circuitry 250 comprises a sense amplifier 206 and a compute component 231 corresponding to respective columns of memory cells (e.g., coupled to respective pairs of complementary digit lines). The sense amplifier 206 can be coupled to the pair of complementary digit lines 205-1 and 205-2. The compute component 231 can be coupled to the sense amplifier 206 via pass gates 207-1 and 207-2. The gates of the pass gates 207-1 and 207-2 can be coupled to logical operation selection logic 213.

The logical operation selection logic 213 can be configured to include pass gate logic for controlling pass gates that couple the pair of complementary digit lines un-transposed between the sense amplifier 206 and the compute component 231 and swap gate logic for controlling swap gates that couple the pair of complementary digit lines transposed between the sense amplifier 206 and the compute component 231. The logical operation selection logic 213 can also be coupled to the pair of complementary digit lines 205-1 and 205-2. The logical operation selection logic 213 can be configured to control continuity of pass gates 207-1 and 207-2 based on a selected logical operation.

The sense amplifier 206 can be operated to determine a data value (e.g., logic state, data state, operand) stored in a selected memory cell. The sense amplifier 206 can comprise a cross coupled latch, which can be referred to herein as a primary latch. In the example illustrated in FIG. 2, the circuitry corresponding to sense amplifier 206 comprises a latch 215 including four transistors coupled to a pair of complementary digit lines D 205-1 and (D)_ 205-2. However, embodiments are not limited to this example. The latch 215 can be a cross coupled latch, e.g., gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2). The cross coupled latch 215 comprising transistors 227-1, 227-2, 229-1, and 229-2 can be referred to as a primary latch.

In operation, when a memory cell is being sensed (e.g., read), the voltage on one of the digit lines 205-1 (D) or 205-2 (D)_ will be slightly greater than the voltage on the other one of digit lines 205-1 (D) or 205-2 (D)_. An ACT signal and an RNL* signal can be driven low to enable (e.g., fire) the sense amplifier 206. The digit lines 205-1 (D) or 205-2 (D)_ having the lower voltage will turn on one of the PMOS transistor 229-1 or 229-2 to a greater extent than the other of PMOS transistor 229-1 or 229-2, thereby driving high the digit line 205-1 (D) or 205-2 (D)_ having the higher voltage to a greater extent than the other digit line 205-1 (D) or 205-2 (D)_ is driven high.

Similarly, the digit line 205-1 (D) or 205-2 (D)_ having the higher voltage will turn on one of the NMOS transistor 227-1 or 227-2 to a greater extent than the other of the NMOS transistor 227-1 or 227-2, thereby driving low the digit line 205-1 (D) or 205-2 (D)_ having the lower voltage to a greater extent than the other digit line 205-1 (D) or 205-2 (D)_ is driven low. As a result, after a short delay, the digit line 205-1 (D) or 205-2 (D)_ having the slightly greater voltage is driven to the voltage of the supply voltage $V_{CC}$ through a source transistor, and the other digit line 205-1 (D) or 205-2 (D)_ is driven to the voltage of the reference voltage (e.g., ground) through a sink transistor. Therefore, the cross coupled NMOS transistors 227-1 and 227-2 and PMOS transistors 229-1 and 229-2 serve as a sense amplifier pair, which amplify the differential voltage on the digit lines 205-1 (D) and 205-2 (D)_ and operate to latch a data value sensed from the selected memory cell. As used herein, the cross coupled latch of sense amplifier 206 may be referred to as a primary latch 215.

Embodiments are not limited to the sense amplifier 206 configuration illustrated in FIG. 2. As an example, the sense amplifier 206 can be a current-mode sense amplifier and a single-ended sense amplifier (e.g., sense amplifier coupled to one digit line). Also, embodiments of the present disclosure are not limited to a folded digit line architecture such as that shown in FIG. 2.

The sense amplifier 206 can, in conjunction with the compute component 231, be operated to perform various logical operations using data from an array as input. In a number of embodiments, the result of a logical operation can be stored back to the array without transferring the data via a digit line address access (e.g., without firing a column decode signal such that data is transferred to circuitry external from the array and sensing circuitry via local I/O lines). As such, a number of embodiments of the present disclosure can enable performing logical operations and compute functions associated therewith using less power than various previous approaches. Additionally, since a number of embodiments eliminate the need to transfer data across local and global I/O lines in order to perform compute functions (e.g., between memory and discrete processor), a number of embodiments can enable an increased (e.g., faster) processing capability as compared to previous approaches.

The sense amplifier 206 can further include equilibration circuitry 214, which can be configured to equilibrate the digit lines 205-1 (D) and 205-2 (D)_. In this example, the equilibration circuitry 214 comprises a transistor 224 coupled between digit lines 205-1 (D) and 205-2 (D)_. The equilibration circuitry 214 also comprises transistors 225-1 and 225-2 each having a first source/drain region coupled to an equilibration voltage (e.g., $V_{DD}/2$), where $V_{DD}$ is a supply voltage associated with the array. A second source/drain region of transistor 225-1 can be coupled digit line 205-1 (D), and a second source/drain region of transistor 225-2 can be coupled digit line 205-2 (D)_. Gates of transistors 224, 225-1, and 225-2 can be coupled together, and to an equilibration (EQ) control signal line 226. As such, activating EQ enables the transistors 224, 225-1, and 225-2, which effectively shorts digit lines 205-1 (D) and 205-2 (D)_ together and to the equilibration voltage (e.g., $V_{CC}/2$).

Although FIG. 2 shows sense amplifier 206 comprising the equilibration circuitry 214, embodiments are not so limited, and the equilibration circuitry 214 may be implemented discretely from the sense amplifier 206, implemented in a different configuration than that shown in FIG. 2, or not implemented at all.

As described further below, in a number of embodiments, the sensing circuitry 250 (e.g., including sense amplifier 206 and compute component 231) can be operated to perform a selected logical operation and initially store the result in one of the sense amplifier 206 or the compute component 231 without transferring data from the sensing circuitry via a local or global I/O line (e.g., without performing a sense line address access via activation of a column decode signal, for instance).

Performance of logical operations (e.g., Boolean logical functions involving data values) is fundamental and commonly used. Boolean logic functions are used in many higher level functions. Consequently, speed and power efficiencies that can be realized with improved logical operations, can translate into speed and power efficiencies of higher order functionalities.

As shown in FIG. 2, the compute component 231 can also comprise a latch, which can be referred to herein as a secondary latch 264. The secondary latch 264 can be configured and operated in a manner similar to that described above with respect to the primary latch 215, with the exception that the pair of cross coupled p-channel transistors (e.g., PMOS transistors) included in the secondary latch can have their respective sources coupled to a supply voltage (e.g., $V_{DD}$), and the pair of cross coupled n-channel transistors (e.g., NMOS transistors) of the secondary latch can have their respective sources selectively coupled to a reference voltage (e.g., ground), such that the secondary latch is continuously enabled. The configuration of the compute component 231 is not limited to that shown in FIG. 2, and various other embodiments are feasible.

FIG. 3 is another schematic diagram illustrating a portion of a memory array 330 coupled to sensing circuitry 350 in accordance with a number of embodiments of the present disclosure. In this example, the memory array 330 can be a DRAM array of 1T1C (one transistor one capacitor) memory cells each comprised of an access device 302-1, 302-2 (e.g., transistor) and a storage element 303-1, 303-2 (e.g., a capacitor), although embodiments are not limited to this configuration.

The cells of the memory array 330 are arranged in rows coupled by word lines (e.g., 304-X (Row X) and 304-Y (Row Y)) and columns coupled by pairs of complementary sense lines (e.g., labeled as digit lines DIGIT(n-1)/DIGIT(n-1)_, DIGIT(n)/DIGIT(n)_, DIGIT(n+1)/DIGIT(n+1)_). The individual sense lines corresponding to each pair of complementary digit lines (D) and (D_) can also be referred to as digit lines 305-1 and 305-2, respectively. Although only three pair of complementary digit lines are shown in FIG. 3, embodiments of the present disclosure are not so limited, and an array of memory cells can include additional columns of memory cells and digit lines (e.g., 4,096, 8,192, 16,384, etc.).

As shown in FIG. 3, a gate of memory cell transistor 302-1 can be coupled to word line 304-Y and a gate of memory cell transistor 302-2 can be coupled to word line 304-X. A first source/drain region of memory cell transistor 302-1 can be coupled to its corresponding digit line 305-1 (D) and a first source/drain region of memory cell transistor 302-2 can be coupled to its corresponding digit line 305-2 (D_). A second source/drain region of memory cell transistor 302-1 can be coupled to corresponding storage element 303-1, and a second source/drain region of memory cell transistor 302-2 can be coupled to corresponding storage element 303-2.

The memory array 330 is coupled to sensing circuitry 350 in accordance with a number of embodiments of the present disclosure. For example, the sensing circuitry 350 can be coupled to the array of memory cells 330 by one or more digit lines (e.g., complementary digit lines 305-1 (D) and 305-2 (D_)) through shift circuitry 323. As such, the sensing circuitry can be configured and/or operated to sense a data value from a memory cell coupled to the digit line (e.g., using the sense amplifier 306 described in connection with FIG. 2), accumulate the data value from the primary latch to the secondary latch without performing a digit line address access (e.g., using the compute component circuitry 331 described in connection with FIG. 2), and invert the data value from the primary latch after the data value is accumulated in the secondary latch. The shift circuitry 323 can be configured to connect the sensing circuitry 350 to a second portion of the array such that at most one of the array and the portion of the second array are coupled to the sensing circuitry at once. The shift circuitry 323 also can be configured such that the array and the second portion of the array can both be simultaneously disconnected from the sensing circuitry.

The sensing circuitry 350, including the sense amplifier 306 and the compute circuit 331, can be coupled to the array 330 via the shift circuitry 323. The shift circuitry 323 can include a pair of isolation transistors 321-1 and 321-2 having gates coupled to a first control signal 322 (e.g., NORM) that, when activated, enables (e.g., turns on) the isolation transistors 321-1 and 321-2 to connect the sensing circuitry 350 (e.g., sense amplifier 306 and the compute circuit 331) to a column of memory cells with which the sensing circuitry 350 is associated. According to various embodiments, conduction of isolation transistors 321-1 and 321-2 can be referred to as a "normal" configuration.

As illustrated in FIG. 3, the shift circuitry 323 also can include another pair of isolation transistors 321-3 and 321-4 having gates coupled to a second control signal 319 (e.g., SHIFT), which may be activated when NORM is deactivated, for example. The isolation transistors 321-3 and 321-4 can be arranged such that the sensing circuitry 350 is coupled to a different set of complementary digit lines than the complementary digit lines to which isolation transistors 321-1 and 321-2 connect sense amplifier 306 and compute circuit 331. For example, enabling isolation transistors 321-3 and 321-4 can connect the sensing circuitry 350 to an adjacent pair of complementary digit lines (e.g., to the right), as shown in FIG. 3.

The shift circuitry 323 is shown in FIG. 3 as having isolation transistors 321-1 and 321-2 coupled to one set of complementary digit lines (e.g., DIGIT(n) and DIGIT(n)_ and isolation transistors 321-3 and 321-4 arranged so as to be coupled to adjacent digit lines in one particular direction (e.g., digit lines DIGIT(n+1) and DIGIT(n+1)_ shown to the right in FIG. 3). However, embodiments of the present disclosure are not so limited. For example, shift circuitry can include, for example, isolation transistors 321-1 and 321-2 coupled to one set of complementary digit lines (e.g., DIGIT(n) and DIGIT(n) and isolation transistors 321-3 and 321-4 arranged so as to be coupled to adjacent digit lines in another particular direction (e.g., digit lines DIGIT(n−1) and DIGIT(n−1) shown to the left in FIG. 3). Various embodiments can include all isolation transistors in a single shift circuitry 323, or other configurations of isolation transistors 321-1, 321-2, 321-3, and/or 321-4 in shift circuitry 323.

The shift circuitry 323 can be configured to connect the sensing circuitry 350 to a pair of complementary digit lines from among a plurality of pairs of complementary digit lines (e.g., selected from among two adjacent pairs of complementary digit lines to the left and right of the pair of complementary digit lines to which isolation transistors 321-1 and 321-2 are coupled). The shift circuitry 323 can be configured to connect the sensing circuitry 350 to a non-adjacent pair of complementary digit lines.

According to various embodiments, during a shift operation the shift circuitry 323 can be configured to skip (e.g., hop over) an adjacent column or adjacent block of columns having at least one memory cell with a defective functionality to a non-adjacent (e.g., next) column and/or block of columns where all memory cells have a normal functionality, as described herein. Moreover, the shift circuitry 323 can be configured to shift data in digit lines further downstream to the next column or block to a corresponding number of columns or blocks of columns in order to retain the data in the digit lines in an original sequence of the data in the digit lines. To accommodate such a data shift implementation, the present disclosure describes inserting a supplementary block of a plurality of columns of memory cells, in at least one embodiment, at least at one end, e.g., at one end or both ends, of each row of the array of memory cells.

As described herein, a row of memory cells in a linear configuration may have a last block of memory cells at each end thereof as originally configured to which a supplementary block may be added at one end or both ends. In embodiments in which the row of memory cells is in what may be termed a circular configuration, one or more figurative end positions may be selected. A supplemental block may be added to the row at, in various embodiments, one or more of the figurative end positions.

FIG. 4 is a schematic diagram illustrating sensing circuitry 450 coupled (e.g, directly or indirectly connected, as described herein) to sense lines 405 (digit lines) in accordance with a number of embodiments of the present disclosure. The sensing circuitry 450 illustrated in FIG. 4 can, in various examples, represent at least a portion of the functionality embodied by and contained in the sensing circuitry with corresponding reference numbers shown in or described in connection with FIGS. 1A-1C, 2, 3, and 5A-5C of the present disclosure. According to various examples, the sensing circuitry 450 can represent at least a portion of the functionality embodied by and contained in the sensing component stripe 124 and/or logic 170, 213, 560 shown in and described in connection with FIGS. 1A-1C, 2, 3, and 5A-5C of the present disclosure. The sense lines 405 (digit lines) illustrated in FIG. 4 can, in various examples, represent at least a portion of the functionality embodied by and contained in the digit lines with corresponding reference numbers shown in and described in connection with FIGS. 2 and 3 of the present disclosure.

FIG. 4 shows sixteen sense amplifiers, e.g., sense amplifiers 0, 1, . . . , 15 shown at 406-0, . . . , 406-15, each coupled to a sense line, which in a DRAM implementation can be a pair of complementary sense lines, e.g., labeled as digit lines DIGIT/DIGIT* 0, DIGIT/DIGIT* 1, . . . , DIGIT/DIGIT* 15 and shown at 405-0, . . . , 405-15. FIG. 4 also shows sixteen compute components, e.g., compute components 0, 1, . . . , 15 shown at 431-0, 431-1, . . . , 431-15, each coupled to a sense amplifier. Corresponding pairs of the sense amplifiers and compute components can contribute to formation of a portion of the sensing circuitry 450, as shown in and described in particular in connection with FIG. 2.

Data values present on each of the pair of complementary digit lines 405-0, . . . , 405-15 can be loaded into the corresponding compute component 431-0, 431-1, . . . , 431-15, e.g., 405-0 to 431-0, as described in connection with FIG. 2. For example, when the pass gates are open, data values on the pair of complementary digit lines can be passed from the sense amplifiers 406-0, . . . , 406-15 to the corresponding compute component, e.g., 406-0 to 431-0. The data values on the pair of complementary digit lines 405-0, . . . , 405-15 can be the data value stored in the sense amplifier 406-0, . . . , 406-15 when the sense amplifier is fired.

The sense amplifiers shown at 406-0, . . . , 406-15 in FIG. 4 can each correspond to sense amplifier 206 shown in FIG. 2. The compute components 431-0, 431-1, . . . , 431-15 shown in FIG. 4 can each correspond to compute component 231 shown in FIG. 2. A combination of one sense amplifier with one compute component can contribute to a portion of the sensing circuitry 450 of a portion of a DRAM memory subarray, e.g., subarray 0, subarray 1, . . . , and subarray N−1 (e.g., 128 subarrays) shown at 125-0, 125-1, . . . , 125-N−1, respectively, that are separated by amplification regions configured to be coupled to a data path 155, as shown in FIG. 1C. As such, the subarrays shown at 125-0, 125-1, . . . , 125-N−1 can each have amplification regions shown at 124-0, 124-1, . . . , 124-N−1 that correspond to sensing component stripe 0, sensing component stripe 1, . . . , and sensing component stripe N−1, respectively. The paired combinations of the sense amplifiers 406-0, . . . , 406-15 and the compute components 431-0, 431-1, . . . , 431-15, shown in FIG. 4, can be included in a sensing component stripe, as shown at 124 in FIG. 1B and at 150/170 in FIG. 1C.

According to various embodiments, indicator components 0, 1, 2, 3 . . . , shown at 459-0, 459-1, 459-2, 459-3, respectively, are coupled to decision components 0, 1, 2, 3 . . . , shown at 460-0, 460-1, 460-2, 460-3, respectively, to contribute to formation of a portion of the sensing circuitry 450. Paired indicator components and decision components, e.g., 459-0 coupled to 460-0, can be allocated in the sensing circuitry 450 such that one such pair of components can be interposed between each end of a predetermined number of combinations of sense amplifiers 406-0, . . . , 406-15, compute components 431-0, 431-1, . . . , 431-15, and complementary digit lines 405-0, . . . , 405-15. As described herein, such combinations can form a block, along with the associated columns of memory cells (not shown) in the array. For example, compute components 431-4 through 431-7 individually coupled to sense amplifiers 406-4 through 406-7 and individually coupled to digit lines 405-4 through 405-7 can contribute to formation of Block A 458-A. Similar sensing circuitry configurations are shown for Block D 458-D, Block B 458-B, and Block C 458-C.

Block A 458-A, for example, can have a paired combination of indicator component 459-1 coupled to decision component 460-1 adjacent one end of Block A 458-A, e.g., indicator component 459-1 can be adjacent sense amplifier 406-4 and decision component 460-1 can be adjacent compute component 431-4 of Block A. In some embodiments, Block A 458-A also can have a paired combination of indicator component 459-2 coupled to decision component 460-2 adjacent the other end of Block A 458-A, e.g., indicator component 459-2 can be adjacent sense amplifier 406-7 and decision component 460-2 can be adjacent compute component 431-7 of Block A. Similar configurations for paired combinations of indicator components coupled to decision components being allocated to at least one end of the adjacent block, e.g., one or both ends, are shown for Block D 458-D, Block B 458-B, and Block C 458-C.

According to various embodiments, the indicator components 459-0, 459-1, 459-2, 459-3 and/or the decision components 460-0, 460-1, 460-2, 460-3 can be coupled to an adjacent Block D 458-D, Block B 458-A, Block B 458-B, and Block C 458-C. For example, decision component 460-1 can be directly coupled to compute component 431-4 in Block B 458-A and indirectly coupled, e.g., having other intervening compute components, to compute components 431-5, 431-6, 431-7, among other compute components.

Decision components 460-0, 460-1, 460-2, 460-3 allocated between adjacent Block D 458-D, Block A 458-A, Block B 458-B, and Block C 458-C, respectively, can be coupled 462-0, 462-1, 462-2, 462-3 to each other. For example, decision component 460-1 adjacent one end of Block A 458-A and one end of Block D 458-D can be coupled to decision component 460-2 adjacent the other end of Block A 458-A to, for example, transmit a decision that Block A 458 is to be skipped (e.g., hopped over) during a shift operation and that the data values are to be shifted to memory cells associated with the digit lines 405-0 through 405-3 of Block D 458-D.

Indicator components 459-0, 459-1, 459-2, 459-3 allocated between adjacent Block D 458-D, Block A 458-A, Block B 458-B, and Block C 458-C, respectively, can be coupled to a controller 140, as described in connection with FIGS. 1A-1C. According to some embodiments, the controller 140 can determine (e.g., access) during initialization, e.g., original power up, start up, rebooting, etc., a functionality (e.g., normal or defective functionality) of memory cells in an array as a predetermined functionality to be stored by an indicator component adjacent a block and/or the functionality can be determined preceding or during, e.g., on the fly, a shift operation.

In some embodiments, the functionality of the memory cells can be determined (predetermined) prior to data being written to the memory cells (e.g., any memory cells) in a block of memory cells, as described herein, in which at least one memory cell in the block does not function to an expected level, e,g., is defective. Hence, an indicator value, as described herein, may be saved in association with such a block to prevent data from being written to that block. The same indicator value can prevent data from being shifted to that block and to indicate that no data is to be shifted from that block, e.g., because no data has been written or stored in that block. In some embodiments, the functionality may be determined on the fly and memory cells in a block determined to be defective may have previously been programmed to store data. Such data may, in some embodiments, be ignored in a shift operation in which data from a source adjacent block skips (e.g., hops over) the defective block to a destination block determined to have all normally functional memory cells, which may be an adjacent block on the other side of the defective block from the source adjacent block.

The controller 140 can send an indicator value to be stored by an indicator component adjacent a block to indicate functionality of memory cells in that adjacent block and/or a particular row of memory cells in that adjacent block. For example, the indicator value may be either 0 or 1. In some embodiments, when all memory cells in the block and/or the particular row have been determined to have normal functionality, an indicator value of 1 can be sent by the controller 140 and stored by the indicator component. In contrast, when at least one memory cell in the block and/or the particular row has been determined to have defective functionality, an indicator value of 0 can be sent by the controller 140 and stored by the indicator component. In some embodiments, the indicator value for normal functionality can be 0 and the indicator value for defective functionality can be 1, or other choices for indicator values can be used.

In some embodiments, the indicator values can be output by the indicator component to a coupled decision component to be used in determining a shift of data based on a determined functionality of a, e.g., at least one, memory cell in the adjacent block. According to some embodiments, an indicator component allocated to a particular side of an adjacent block can be used to store the indicator value for that block and output that indicator value to a coupled decision component for use in determining the shift regardless of the direction of the shift operation. For example, indicator component 459-0 can store the indicator value for adjacent Block D 458-D, indicator component 459-1 can store the indicator value for adjacent Block A 458-A, indicator component 459-2 can store the indicator value for adjacent Block B 458-B, and indicator component 459-3 can store the indicator value for adjacent Block C 458-C. Output of the appropriate indicator value to the corresponding decision component, e.g., 459-1 to 460-1, along with the decision components 460-0, 460-1, 460-2, 460-3 being coupled 462-0, 462-1, 462-2, 462-3 to each other, can enable performance of shift decisions, as described further in connection with FIGS. 5A-5C.

For clarity, each block is shown in FIG. 4 to include four combinations of sense amplifiers, compute components, and complementary digit lines, which could correspond to four columns of memory cells. However, embodiments are not limited to this example. For example, in various embodiments, each block can include 4, 8, 16, or 32 such combinations, among other possible numbers. For example, each block for a particular row of memory cells can have the same number of such combinations and memory cells in order to facilitate shifting of equal numbers of columns or sense lines during a shift operation from block to block.

The embodiment illustrated in FIG. 4 can represent a portion in the middle of a sequence of blocks 458 associated with the sensing circuitry 450, sense lines 405, and columns of memory cells (not shown). For example, there may be additional blocks, sensing circuitry, and columns of memory cells, etc., at the top of the sequence 464-1 and at the bottom of the sequence 464-2 in the orientation shown in FIG. 4. As such, a sensing component stripe 124 and/or logic 170, 213, 560 containing at least a portion of the functionality embodied by and described in connection with FIG. 4 also can extend further in each direction.

In some embodiments, however, Block C 458-C and/or Block D 458-D can represent a supplementary block at either end of an array or a row section of an array, e.g., each row section accessed by at least 512 sense lines, to accommodate a data shift of one block to retain the data in the sense lines in the original sequence of the sense lines. For example, if Block B 458-B was skipped during a shift operation for the data from Block C 458-C to be stored in Block A 458-A, the data from Block A 458-A can be shifted to Block D 458-D serving as a supplementary block at the end of the array or the row section. As such, the data shift skipping over the one block to be stored in the next block could retain the data in the memory cells of the blocks in the original sequence, e.g., rather than the data from Block A 458-A being shifted elsewhere if the supplementary Block D 458-D had not been inserted to accommodate such a shift operation.

According to various embodiments of the present disclosure, a memory device, e.g., 120 in FIG. 1A, can be configured to couple to a host, e.g., 110 in FIG. 1A, via a data bus, e.g., 156 in FIG. 1A, and a control bus, e.g., 154 in FIG. 1A. A bank section in the memory device, e.g., 123 in FIG. 1B, can include an array of memory cells, e.g., 130 in FIG. 1A, and sensing circuitry, e.g., 150 in FIG. 1A, coupled to the array via a plurality of sense lines, e.g., 205-1 and 205-2 in FIG. 2 and at corresponding reference numbers in FIGS. 3 and 4. The sensing circuitry can include a sense amplifier and a compute component, e.g., 206 and 231, respectively, in FIG. 2 and at corresponding reference numbers in FIGS. 3 and 4, coupled to a sense line and configured to implement logical operations and a decision component, e.g., as shown at 460 in FIG. 4 and at corresponding reference numbers in FIGS. 5A-5C, configured to implement a shift of data based on a determined, e.g., predetermined, functionality of a, e.g., at least one, memory cell in the array, as described herein. A controller, e.g., 140 in FIGS. 1A-1C, in the memory device can be configured to couple to the array and sensing circuitry.

The plurality of sense lines can, in various embodiments, be partitioned into a number of blocks, e.g., Block D 458-D, Block A 458-A, Block B 458-B, and Block C 458-C in FIG. 4. The apparatus can include an indicator component, e.g., as shown at 459 in FIG. 4 at corresponding reference numbers in FIGS. 5B-5C, coupled to the decision component to provide the determined functionality. The indicator component can be configured to be set with the determined functionality at a power up of the array to indicate to the decision component either a normal functionality of all memory cells in an adjacent block of the plurality of sense lines or a defective functionality of a memory cell in the adjacent block of the plurality of sense lines.

For example, the indicator component can be configured to provide an indicator of the determined functionality of the, e.g., at least one, memory cell in the plurality of sense lines in an adjacent block of sense lines, e.g., an indicator from indicator component 459-0 indicating whether at least one memory cell associated with sense lines 405-1 through 405-3 of Block 458-D has a defective functionality. The indicator of the determined functionality of the memory cell in the plurality of sense lines in the adjacent block of sense lines can be configured to be input to the decision component, e.g., as shown at 459 and 460 in FIG. 4 and at corresponding reference numbers in FIGS. 5B-5C.

The array of memory cells described herein can, in some embodiments, be an array of DRAM cells. As such, the sense amplifier can be coupled to a pair of complementary sense lines, e.g., 205-1 and 205-2 in FIG. 2 and at corresponding reference numbers in FIGS. 3 and 4. Each of the plurality of sense lines can be individually coupled to one of a plurality of sense amplifiers coupled to a compute component, e.g., 305-1 and 305-2 in FIG. 3 and at corresponding reference numbers in FIG. 4.

The apparatus can include shift circuitry, e.g., 323 and described in connection with FIG. 3, configured to shift a data value from a, e.g., at least one, memory cell coupled to a first sense line to a, e.g., at least one, memory cell coupled to a second sense line. In various embodiments, the sense amplifier can include a primary latch and the compute component can include a secondary latch, where the first and secondary latches can be configured to shift a data value, e.g., functioning as part of the shift circuitry, from the memory cell coupled to the first sense line to the memory cell coupled to the second sense line. The first sense line can be allocated to a plurality of sense lines in a first block, e.g., as shown at 405-0 through 405-3 of Block 458-D in FIG. 4, and the second sense line can be allocated to a plurality of sense lines in a second block, e.g., as shown at 405-4 through 405-7 of Block 458-A in FIG. 4, where the second Block 458-A does not overlap the first Block 458-A.

Figure 5A:
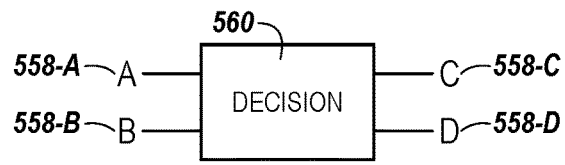
FIGS. 5A-5C are schematic diagrams illustrating a portion of sensing circuitry to a memory device in accordance with a number of embodiments of the present disclosure.
Figure 5B:
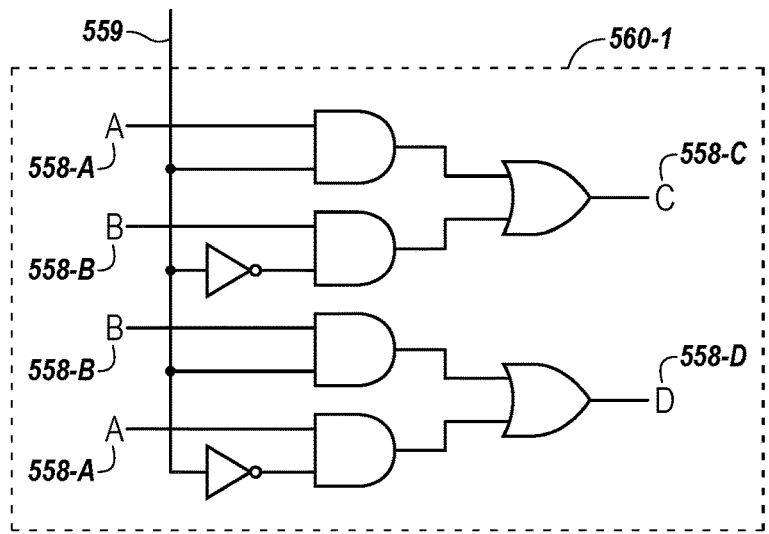
Figure 5C:
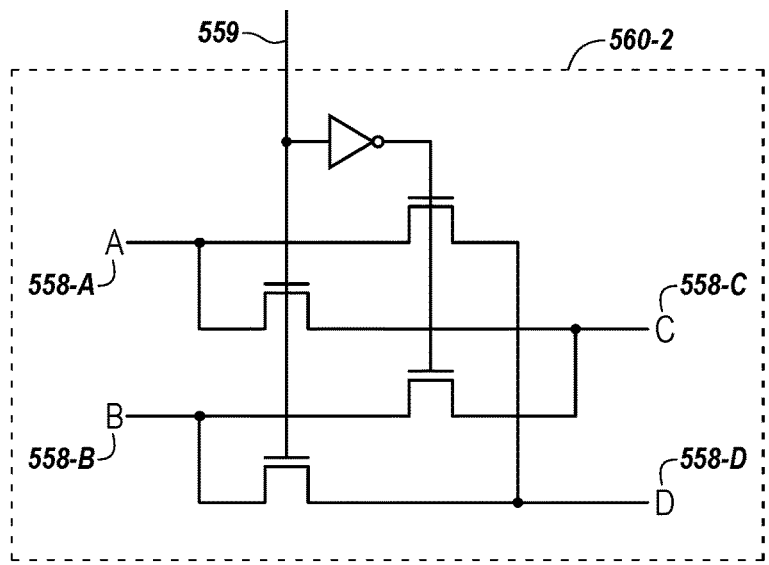

The decision component can, according to various embodiments, be configured to decide, e.g., as shown at 560 and corresponding reference numbers in FIGS. 5B-5C, the shift based on, e.g., at least in part on, input of the indicator of the determined functionality of the memory cell in the plurality of sense lines in the adjacent block of sense lines. The decision component can be configured to decide between implementation of the shift to an adjacent block of a plurality of sense lines and a non-adjacent block, e.g., the next block, of a plurality of sense lines by skipping the adjacent block. The decision component of the adjacent block can be coupled to the non-adjacent block, e.g., a decision component of the non-adjacent block, as shown by decision component 460-0 of Block 458-D being coupled 462-0 to decision component 460-1 of Block 458-A in FIG. 4. The decision component of the adjacent block can be configured to direct the data shift to the plurality of sense lines of the non-adjacent block, e.g., as shown at and described in connection with 560 and corresponding reference numbers in FIGS. 5B-5C.

Embodiments of the present disclosure provide a number of methods for making shift decisions. For example, the shift decision can determine shifting data left or right and potentially skipping columns and/or blocks of memory cells in a shift operation, e.g., in a PIM array of a DRAM implementation, for writing and/or reading of data values, e.g., based at least partially on a stored indicator value, as described herein. The method can include receiving control signals from a controller 140 to shift data in a row of memory cells. As described herein, the method can include accessing a memory device comprising the indicator value that indicates a predetermined functionality of a memory cell. The method can further include deciding, in response to the predetermined functionality of the memory cell indicated by the indicator value, whether to shift data to either an adjacent block of a plurality of sense lines or to a non-adjacent block of a plurality of sense lines in the memory device. In response to the deciding such that the data is moved to a decided one of the adjacent block and the non-adjacent block.

A bank in the memory device can, as described herein, include an array of memory cells and sensing circuitry coupled to the array via a plurality of sense lines. The sensing circuitry can include sense amplifiers and compute components coupled to a sense line and configured to implement logical operations, and a decision component coupled to an adjacent block of a plurality of sense lines.

The control signals can enable implementation (execution) of accessing a memory device comprising an indicator value that indicates a predetermined functionality of a memory cell. The control signals can further enable deciding, in response to the predetermined functionality of the memory cell indicated by the indicator value, whether to shift data to either an adjacent block of a plurality of sense lines or to a non-adjacent block of a plurality of sense lines in the memory device. In response to the deciding, the method can include shifting the data such that the data is moved to a decided one of the adjacent block and the non-adjacent block.

The decision component can be configured to decide a shift of data based on a determined functionality of a, e.g., at least one, memory cell in the adjacent block. The method can include shifting the data to either the adjacent block or a non-adjacent block, e.g., a next block after the adjacent block in the direction of the data shift, of a plurality of sense lines based on the determined functionality of the memory cell in the adjacent block. In some embodiments, the plurality of sense lines can be configured such that each sense line for a column of memory cells is coupled to a particular sense amplifier and compute component.

The method can include configuring an indicator component to store an indicator value of the determined functionality to indicate either a normal functionality of all memory cells or a defective functionality of the memory cell, e.g., at least one memory cell, in the adjacent block. The indicator value can be input to the decision component to decide the shift based on, e.g., at least in part on, the indicator value. The method can include performing a shift operation according to the shift decision by the decision component. For example, the shift decision can be shifting the data to the non-adjacent block, e.g., the next block, based on the indicator value indicating the defective functionality of the memory cell in the adjacent block. In some embodiments, a column decoder, e.g., as shown at 152 and described in connection with FIG. 1A, can be configured to access the shifted data by skipping the adjacent block and accessing the non-adjacent block.

FIGS. 5A-5C are schematic diagrams illustrating a portion of sensing circuitry to a memory device in accordance with a number of embodiments of the present disclosure. The decision components 560, 560-1, 560-2 shown in FIGS. 5A-5C, respectively, can represent at least a portion of the functionality embodied by and contained in the sensing circuitry 450 illustrated in FIG. 4 that can, in various examples, include a number of decision components, e.g., as shown at and described in connection with 460-0, 460-1, 460-2, 460-3 of FIG. 4 of the present disclosure.

The lines shown in the context of the decision components 560, 560-1, 560-2 shown in FIGS. 5A-5C are meant to represent a decision (and how such a decision may be made in FIGS. 5B-5C) as to whether a shift of data in a direction from Block 458-A to Block 458-B will be performed by shifting the data to Block 458-B or skipping Block 458-B and shifting the data to Block 458-C. The lines shown in the context of the decision components 560, 560-1, 560-2 shown in FIGS. 5A-5C also are meant to represent a decision as to whether a shift of data in a direction from Block 458-B to Block 458-A will be performed by shifting the data to Block 458-A or skipping Block 458-A and shifting the data to Block 458-D. The lines shown in the context of the decision components 560, 560-1, 560-2 shown in FIGS. 5A-5C are not meant to represent the coupling of decision components 460 shown in and described in connection with FIG. 4, other than input 559 in FIGS. 5B-5C of an indicator value from an indicator component 459, as shown in and described in connection with FIG. 4.

As illustrated in FIG. 5A, each decision component 560 can include a two-to-two semiconductor crossbar switch. The two-to-two semiconductor crossbar switch of the decision component 560 can be configured to determine a particular block to shift data to relative to the adjacent block having an defective functionality of the at least one memory cell. The two-to-two semiconductor crossbar switch can be configured to determine the particular block to which the data is shifted based on, e.g., at least in part on, control signals received from the controller 140 to shift the data in a row of memory cells in a particular direction.

According to various embodiments, referring to the blocks illustrated in FIG. 4, the controller 140 can direct a data shift in a row in a direction from Block 558-A to Block 458-B. The indicator component 459-2 shown in FIG. 4 can input an indicator to decision component 460-2 that there is a memory cell with defective functionality in Block 458-B. The decision component 560 shown in FIG. 5A can determine, e.g., decide, a shift of data based thereon in which Block 558-B is skipped, e.g., hopped over, in the shift operation such that the data from Block 558-A is shifted to Block 558-C, which is in the direction of the instructions from the controller. A decision can be made that Block 558-B is not skipped when decision component 460-2 inputs an indicator that all memory cells in the row of Block 458-B have normal functionality.

In this example, the stored indicators from Blocks 458-A, 458-B, and 458-C can be shared and utilized in making and implementing the shift decision because decision component 460-1 of Block 458-A is coupled 462-1 to decision component 460-2 of Block 458-B, which is also coupled 462-2 to decision component 460-3 of Block 458-C. As such, the decision can be made that the data should be shifted from Block 458-A to Block 458-C by skipping over Block 458-B. Such a decision can be made, at least in part, by input to decision component 460-1 of Block 458-A of an indicator value from Block 458-B that at least one memory cell in the row is defective and an indicator value from Block 458-C that all memory cells in the row of Block 458-C have a normal functionality. If, in this example, there is an indicator that a memory cell in the row of Block 458-C has a defective functionality, a shift can be decided and implemented whereby the data is shifted to a block further downstream in the intended direction wherein all memory cells in the row have a normal functionality. Such information may be shared via the coupling between the decision components downstream from the defective block, e.g., in the direction of the data shift, such that the data will be shifted one block downstream relative to the position of the defective block until reaching the supplementary block at the end of the row and/or row section. The decision components just described can be coupled to the shift circuitry, e.g., 323 and described in connection with FIG. 3, to direct and enable implementation of the shift decision.

Conversely, the controller 140 can direct a data shift in the row in a direction from Block 458-B to Block 558-A. The indicator component 459-1 shown in FIG. 4 can input an indicator to decision component 460-1 that there is a memory cell with defective functionality in Block 458-A. The decision component 560 shown in FIG. 5A can determine, e.g., decide, a shift based thereon in which Block 558-A is skipped in the shift operation such that the data from Block 558-B is shifted to Block 558-D, which is in the direction of the instructions from the controller.

For example, when the indicator value of indicator component 459-2 of Block B 458-B in FIG. 4 is 0, indicating at least one memory cell with a defective function, Block B can be skipped when shifting the data in the direction from Block A 458-A to Block B and the data can be shifted to Block D 458-C instead. In contrast, when the indicator value of indicator component 459-2 of Block B 458-B is 1, indicating all memory cells to have a normal function, the data can be shifted as usual from Block A 458-B to Block B.

Alternatively, when the indicator value of indicator component 459-1 of Block A 458-A is 0, Block A can be skipped when shifting the data in the direction from Block B 458-B to Block A and the data can be shifted to Block D 458-D instead. In contrast, when the indicator value of indicator component 459-1 of Block A 458-A is 1, the data can be shifted as usual from Block B 458-B to Block A.

According to various embodiments of the decision component of the present disclosure, the two-to-two semiconductor crossbar switch can be configured as logic circuitry, e.g., as shown at 560-1 in FIG. 5B, to implement a logical data shift. For example, based upon input 559 of indicator values from the appropriate indicator component, logical operations, such as AND, OR, NOT, NAND, NOR, and XOR, and invert (e.g., inversion) logical operations, can be performed to yield a decision by the decision component as to whether a particular block is skipped during a shift operation in a particular direction. Such logic circuitry 560-1 can, in various embodiments, contribute to formation of a portion of the sensing circuitry and/or complement the sensing circuitry, as shown at 170/213 and described in connection with FIGS. 1A, 1C, 2, and 3. Alternatively or in addition, the two-to-two semiconductor crossbar switch can be configured as having a plurality of transistors, e.g., as shown at 560-2 in FIG. 5C, to implement the shift of the data.

According to various embodiments of the present disclosure, an apparatus can include a controller, e.g., 140, that can be coupled to a bank of a memory device, e.g., 121, to issue control signals to shift data in a row of memory cells. A bank can, in various embodiments, include an array of memory cells, e.g., 130, and sensing circuitry, e.g., 150 in FIG. 1A and at corresponding reference numbers in FIGS. 2, 3, and 4, on pitch with the array and coupled to the array via a plurality of sense lines, e.g., 205-1 and 205-2 in FIG. 2 and at corresponding reference numbers in FIGS. 3 and 4.

The sensing circuitry can include a sense amplifier, e.g., 206 in FIG. 2 and at corresponding reference numbers in FIGS. 3 and 4, coupled to a, e.g., at least one, sense line, a compute component, e.g., 231 in FIG. 2 and at corresponding reference numbers in FIGS. 3 and 4, coupled to the sense amplifier, and a decision component, e.g., as shown at 460-0, 460-1, 460-2, 460-3 in FIG. 4 and at corresponding reference numbers in FIGS. 5A-5C. The decision component, e.g., 460-0 in FIG. 4, can be configured to decide a shift of data, e.g., as described in connection with FIGS. 5A-5C, based on a determined functionality of a memory cell, e.g., at least one memory cell, in an adjacent block of a plurality of sense lines, e.g., Block-D in FIG. 4.

According to embodiments described herein, the apparatus can include shift circuitry, e.g., 323 in FIG. 3, configured to selectively execute, e.g., implement the decision by the decision circuitry, a shift of a data value from a, e.g., at least one, memory cell coupled to a first sense line, e.g., sense line 405-4 in FIG. 4, to a, e.g., at least one, memory cell coupled to a second sense line, e.g., sense line 405-8 in FIG. 4, according to the shift decision by the decision component. As described herein, the shift circuitry can be coupled to and/or integrated with components of the sensing circuitry, such as sense amplifiers, compute components, decision components, indicator components, etc., and/or logic associated with the sensing circuitry, e.g., 170 and/or 213 and described in connection with FIGS. 1A and 1C and 2 and/or 560, 560-1, 560-2 and described in connection with FIGS. 5A-5C, to receive instructions for execution of the shift.

According to various embodiments, the decision component can be coupled to at least one of an adjacent sense amplifier and compute component of a plurality of sense amplifiers and coupled compute components in the adjacent block of the plurality of sense lines, e.g., decision component 460-0 can be coupled to compute component 431-0 in Block 458-D. An indicator component, e.g., 459-0, 459-1, 459-2, 459-3 in FIG. 4 and at corresponding reference numbers in FIGS. 5B-5C, can be coupled to the decision component, e.g., 460-0, 460-1, 460-2, 460-3 in FIG. 4 and at corresponding reference numbers in FIGS. 5A-5C, to input the determined functionality as either a normal functionality of all memory cells or defective functionality of the memory cell in the adjacent block of a plurality of sense lines.

The controller 140 can be configured to direct input of an indicator value, e.g., 0 or 1, among other possible indicator values, to the indicator component. The indicator value can indicate either a normal functionality of all memory cells or a defective functionality of the, e.g., at least one, memory cell in the adjacent block. The indicator value can be stored by the indicator component for input to the decision component.

The decision component can, as described herein, be configured to direct a skip, e.g., hop over, of the adjacent block of the plurality of sense lines to a non-adjacent block of a plurality of sense lines, e.g., a next block of a plurality of sense lines, based on the determined functionality indicating a defective functionality of the memory cell in the adjacent block. The shift circuitry can be configured to execute the skip of the adjacent block of the plurality of sense lines to the non-adjacent block of the plurality of sense lines during a data shift operation. The shift circuitry can be configured to execute a data shift of one block for sense lines, e.g., all sense lines, in a row section, e.g., each row section being accessed by at least 512 sense lines, in a direction of the skip to the non-adjacent block, e.g., further downstream from the non-adjacent block.

According to various embodiments, the array can be configured to have a, e.g., at least one, supplementary block of a plurality of sense lines for memory cells in the row of memory cells, e.g., Block 458-C and/or Block 458-D and described in connection with FIG. 4. A row can be configured to have a plurality of supplementary blocks. The plurality of supplementary blocks can be provided, e.g., formed, at a fixed spacing relative to a plurality of blocks coupled to the plurality of sense lines. For example, the row can be configured to have a supplementary block at one end or both ends of each row section.

The array can, in various embodiments, be configured to have the decision component and the coupled indicator component inserted between a plurality of sense amplifiers and coupled compute components in different blocks of the plurality of sense lines. For example, as shown in FIG. 4, decision component 460-1 and coupled indicator component 459-1 are inserted between Block 458-D and Block 458-A. The decision components and the coupled indicator components can be inserted at a fixed frequency relative to the plurality of sense amplifiers and coupled compute components. For example, as shown in FIG. 4, each of the four blocks 458 has four sense amplifiers 406 and four coupled compute components 431 with one of the decision components 460 and the coupled indicator components 459 inserted between each block, thereby resulting in a fixed frequency of one decision component and coupled indicator component inserted per a plurality of four sense amplifiers and coupled compute components. The plurality of sense amplifiers and coupled compute components per block is not limited to four. For example, in various embodiments, each block can include 4, 8, 16, or 32 such combinations, among other possible numbers.

A bank and bank sections of a memory device, e.g., 121/123 in FIGS. 1B-1C, can, according to some embodiments, include a first sensing component stripe, e.g., 124-0 in FIG. 1B and 150/170 in FIG. 1C, for a first subarray, e.g., 125-0 in FIGS. 1A and 1C, and a second sensing component stripe, e.g., 124-1 in FIG. 1B and at 150/170 in FIG. 1C, for a second subarray, e.g., 125-1 in FIGS. 1A and 1C. As described herein, each sensing component stripe can include a sense amplifier and a compute component coupled to each corresponding column of memory cells, e.g., 122 in FIG. 1B, in the first and second subarrays. Each sensing component stripe also can include the decision component and the coupled indicator component inserted at a fixed frequency relative to the plurality of sense amplifiers and coupled compute components.

As illustrated in FIGS. 1B-1C, a sensing component stripe can, in various embodiments, extend from one end of a subarray to an opposite end of the subarray. For example, as shown for subarray 0 (125-0), sensing component stripe 0 (124-0), shown schematically in more detail in FIG. 4, can include sense amplifier 0 (406-0) and compute component 0 (431-0) to sense amplifier 15 (406-15) and compute component 15 (431-15) of subarray 0 (125-0) and extend beyond from both ends, as indicated at 464-1 and 464-2. As shown in FIG. 4, the decision component and the coupled indicator component can be included in sensing component stripe 0 (124-0) at a fixed frequency relative to the plurality of sense amplifiers and coupled compute components.

As described herein and shown in FIG. 4, a column can be configured to include a pair of complementary sense (digit lines), which can be referred to as digit line and digit line*, as shown at 405-0 through 405-15. However, alternative embodiments can include a single sense (digit line) for a single column of memory cells. Embodiments are not so limited.

Embodiments of the present disclosure provide a number of methods for making shift decisions. According to various embodiments as described herein, a method can include operating a memory device. Operating the memory device can include receiving control signals from a controller coupled to the memory device to shift data in a row of memory cells and sending an indicator value, as directed by the controller, for storage by the indicator component, as described herein.

In various embodiments, the memory device can include a sense amplifier and a compute component coupled to a sense line for each of a respective plurality of columns of memory cells. The plurality of columns can be partitioned into blocks, e.g., each block having 4, 8, 16, or 32 columns, and a supplementary block of the plurality of columns of memory cells at a fixed spacing in the respective plurality of columns. For example, in various embodiments, a supplementary block can be provided, e.g., formed, at one or both ends of each row of memory cells in the plurality of columns and/or at one or both ends of each row section in the plurality of columns of memory cells, e.g., providing such a supplementary block for each row section of the array accessed by 512 columns. Providing such a supplementary block at one or both ends of each row section, compared to being provided at one or both ends of each row, can enable compensation for defective functionality of a memory cell in each of the blocks rather than compensation for defective functionality of one memory cell per row, e.g., having 16,384 columns. The memory device can include a column including a decision component coupled to an indicator component adjacent each block of the plurality of columns of memory cells, e.g., inserting such a column adjacent each block having 4, 8, 16, or 32 columns. In some embodiments, the memory device can further include a controller to couple the indicator component to send, e.g., on memory device initialization and/or preceding or during a shift operation, an indicator value for storage by, e.g., a latch of, the indicator component.

In some embodiments, the indicator component can be configured to correspond to a sense amplifier 206, e.g., as described in connection with FIG. 2, and the latch of the indicator component can correspond to the primary latch 215 of the sense amplifier. In some embodiments, the decision component can be configured to correspond to a compute component 231, e.g., as described in connection with FIG. 2, and the decision component can, in some embodiments, correspond to the secondary latch 264 of the compute component.

The method can include outputting the stored indicator value, e.g., as shown at 459 in FIGS. 5B and 5C, by the indicator component, e.g., the latch of the indicator component, for input to transistors of the decision component, e.g., as shown at 560-2 in FIG. 5C. As described in connection with FIGS. 5A-5C, the transistors can determine a shift that either enables an adjacent block to be used or the adjacent block to be skipped, e.g., hopped over, during a data shift operation.

The method can include configuring shift circuitry to execute a data shift of one block on sense lines, e.g., all sense lines, in a row section in a direction of a skip, e.g., hop, to the non-adjacent block. As such, the data shift of one block can be executed on sense lines further downstream from the non-adjacent block, e.g., the next block after the adjacent block, to retain the data in the sense lines in an original sequence of the sense lines. For example, the shift circuitry can be configured to execute a data shift of one block on sense lines further downstream from a skipped block.

The data shift of one block can be executed to retain the data in shifted sense lines in the same positions of memory cells as in memory cells of original sense lines. For example, data stored in a particular sequence in memory cells of each column and/or row of a block can be shifted to a different block to retain the particular sequence in memory cells of each column and/or row of the different block even when an intervening block has been skipped. For example, data from a row accessed through sense line 405-11 in Block 458-B can be shifted to the same row accessed through sense line 405-3 in Block 458-D even though Block 458-A has been skipped, e.g., rather than the data being shifted a different row and/or being shifted so as to be accessed through a different sense line, such as 405-1. The method can include configuring the supplementary block at one or both ends of each row section to accommodate a data shift of one block to retain the data in the sense lines in the original sequence and/or position of the sense lines. The method can include reading the stored indicator value during either a read operation or a write operation and determining that either an adjacent block is to be used or the adjacent block is to be skipped during the read or write operation.

While example embodiments including various combinations and configurations of sensing circuitry, sense amplifiers, compute components, shift circuitry, decision components, indicator components, sensing component stripes, logic circuitry, etc., have been illustrated and described herein, embodiments of the present disclosure are not limited to those combinations explicitly recited herein. Other combinations and configurations of the sensing circuitry, sense amplifiers, compute components, shift circuitry, decision components, indicator components, sensing component stripes, logic circuitry, etc., disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a controller coupled to a memory device, wherein the memory device comprises:
   an array of memory cells;
   sensing circuitry coupled to the array via a plurality of sense lines, wherein the sensing circuitry includes:
   a sense amplifier coupled to a sense line;
   a compute component coupled to the sense amplifier; and
   a decision component configured to decide a shift of data based on a determined functionality of a memory cell in an adjacent block of a plurality of sense lines; and
   shift circuitry configured to selectively execute a shift of a data value from a memory cell coupled to a first sense line to a memory cell coupled to a second sense line according to the shift decision.

2. The apparatus of claim 1, wherein the decision component is coupled to at least one of an adjacent sense amplifier and compute component of a plurality of sense amplifiers and coupled compute components in the adjacent block of the plurality of sense lines.

3. The apparatus of claim 1, wherein the apparatus further comprises an indicator component coupled to the decision component to input the determined functionality as either a normal functionality of all memory cells or a defective functionality of the memory cell in the adjacent block.

4. The apparatus of claim 1, wherein:
   the controller is configured to direct input of an indicator value to an indicator component;
   the indicator value indicates either a normal functionality of all memory cells or a defective functionality of the memory cell in the adjacent block; and
   the indicator value is stored by the indicator component for input to the decision component.

5. The apparatus of claim 1, wherein:
   the decision component is configured to direct a skip of the adjacent block of the plurality of sense lines to a non-adjacent block of a plurality of sense lines based on the determined functionality; and
   the determined functionality indicates a defective functionality of the memory cell in the adjacent block.

6. The apparatus of claim 5, wherein the shift circuitry is configured to execute the skip of the adjacent block of the plurality of sense lines to the non-adjacent block of the plurality of sense lines during a data shift operation.

7. The apparatus of claim 6, wherein the shift circuitry is configured to execute a data shift of one block for sense lines in a row section in a direction of the skip to the non-adjacent block.

8. The apparatus of claim 1, wherein the array is configured to have a supplementary block of a plurality of sense lines for memory cells in a row of memory cells.

9. The apparatus of claim 8, wherein:
the row is configured to have a plurality of supplementary blocks; and
the plurality of supplementary blocks are provided at a fixed spacing relative to a plurality of blocks coupled to the plurality of sense lines.

10. The apparatus of claim 8, wherein the row is configured to have a supplementary block at one end of each row section.

11. The apparatus of claim 1, wherein:
the array is configured to have the decision component and a coupled indicator component inserted between a plurality of sense amplifiers and coupled compute components in different blocks of the plurality of sense lines; and
the decision components and the coupled indicator components are inserted at a fixed frequency relative to the plurality of sense amplifiers and coupled compute components.

12. The apparatus of claim 1, wherein the decision component comprises:
a two-to-two semiconductor crossbar switch;
wherein the two-to-two semiconductor crossbar switch is configured to determine a particular block to shift data to relative to the adjacent block having a defective functionality of the memory cell.

13. The apparatus of claim 12, wherein the two-to-two semiconductor crossbar switch is configured to determine the particular block to which the data is shifted based on control signals issued by the controller to shift the data in the row of memory cells in a particular direction.

14. The apparatus of claim 13, wherein the two-to-two semiconductor crossbar switch is configured as logic circuitry to implement a logical data shift.

15. The apparatus of claim 12, wherein the two-to-two semiconductor crossbar switch is configured as having a plurality of transistors to implement the shift of the data.

16. The apparatus of claim 1, wherein the memory device further comprises:
a first sensing component stripe for a first subarray and a second sensing component stripe for a second subarray; wherein:
each sensing component stripe includes a sense amplifier and a compute component coupled to each corresponding column of memory cells in the first and second subarrays; and
each sensing component stripe also includes the decision component and a coupled indicator component inserted at a fixed frequency relative to the plurality of sense amplifiers and coupled compute components.

17. A method for operating a memory device, comprising:
accessing a memory device comprising an indicator value that indicates a predetermined functionality of a memory cell;
deciding, in response to the predetermined functionality of the memory cell indicated by the indicator value, whether to shift data to either an adjacent block of a plurality of sense lines or to a non-adjacent block of a plurality of sense lines in the memory device; and
shifting the data in response to the deciding such that the data is moved to a decided one of the adjacent block and the non-adjacent block.

18. The method of claim 17, wherein the method further comprises:
configuring an indicator component to store the indicator value of the predetermined functionality to indicate either a normal functionality of all memory cells or a defective functionality of the memory cell in the adjacent block; and
inputting the indicator value to the decision component to decide the shift based on the indicator value.

19. A method for operating a memory device, comprising:
receiving control signals from a controller coupled to the memory device to shift data in a row of memory cells;
wherein the memory device comprises:
a sense amplifier and a compute component coupled to a sense line for each of a respective plurality of columns of memory cells;
the plurality of columns partitioned into blocks;
a supplementary block of the plurality of columns of memory cells at a fixed spacing in the respective plurality of columns; and
a column including a decision component coupled to an indicator component adjacent each block of the plurality of columns of memory cells; and
wherein the method further comprises:
sending an indicator value, as directed by the controller, for storage by the indicator component.

20. The method of claim 19, wherein the method further comprises:
outputting the stored indicator value by the indicator component for input to transistors;
wherein the transistors determine a shift that either enables an adjacent block to be used or the adjacent block to be skipped during a data shift operation.

21. The method of claim 19, wherein the method further comprises:
configuring shift circuitry to execute a data shift of one block on sense lines in a row section in a direction of a skip to a non-adjacent block; and
wherein the data shift of one block is executed on sense lines further downstream from the non-adjacent block to retain the data in the sense lines in an original sequence of the sense lines.

22. The method of claim 19, wherein the method further comprises:
configuring shift circuitry to execute a data shift of one block on sense lines further downstream from a skipped block;
wherein the data shift of one block is executed to retain the data in shifted sense lines in same positions of memory cells as in memory cells of original sense lines.

23. The method of claim 19, wherein the method further comprises configuring the supplementary block at one end of each row section to accommodate a data shift of one block to retain the data in the sense lines in the original sequence of the sense lines.

24. An apparatus, comprising:
a memory device, comprising:
an array of memory cells;
sensing circuitry coupled to the array via a plurality of sense lines, the sensing circuitry including:
a sense amplifier and a compute component coupled to a sense line and configured to implement logical operations; and
a decision component configured to determine whether to shift data based on a determined functionality of a memory cell in the array; and
shift circuitry configured to shift a data value based on the determined functionality from a memory cell coupled to a first sense line to a memory cell coupled to a second sense line.

25. An apparatus, comprising:
a memory device, comprising:
   an array of memory cells; and
   sensing circuitry coupled to the array via a plurality of sense lines, the sensing circuitry including:
      a sense amplifier and a compute component coupled to a sense line and configured to implement logical operations; and
      a decision component configured to implement a shift of data based on a determined functionality of a memory cell in the array; wherein:
the sense amplifier includes a primary latch and the compute component includes a secondary latch; and
the primary and secondary latches are configured to shift a data value from a memory cell coupled to a first sense line to a memory cell coupled to a second sense line.

26. An apparatus, comprising:
a memory device, comprising:
   an array of memory cells; and
   sensing circuitry coupled to the array via a plurality of sense lines, the sensing circuitry including:
      a sense amplifier and a compute component coupled to a sense line and configured to implement logical operations; and
      a decision component configured to implement a shift of data based on a determined functionality of a memory cell in the array;
wherein the decision component is configured to decide the shift of the data based on input of an indicator of the determined functionality of the memory cell in a plurality of sense lines in an adjacent block of sense lines.

27. A method for operating a memory device, comprising:
accessing a memory device comprising an indicator value that indicates a predetermined functionality of a memory cell;
configuring an indicator component to store the indicator value of the predetermined functionality to indicate either a normal functionality of all memory cells or a defective functionality of the memory cell in the adjacent block;
inputting the indicator value to a decision component configured to decide the shift based on the indicator value; and
deciding, by the decision component, whether to shift data to either an adjacent block of a plurality of sense lines or to a non-adjacent block of a plurality of sense lines in the memory device.

* * * * *